US012581695B2

(12) United States Patent
Kasahara et al.

(10) Patent No.: US 12,581,695 B2
(45) Date of Patent: Mar. 17, 2026

(54) SEMICONDUCTOR DEVICE

(71) Applicant: Kioxia Corporation, Tokyo (JP)

(72) Inventors: Yusuke Kasahara, Yokkaichi Mie (JP);
Kappei Imamura, Kuwana Mie (JP);
Akifumi Gawase, Kuwana Mie (JP);
Shinji Mori, Nagoya Aichi (JP);
Akihiro Kajita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 383 days.

(21) Appl. No.: 18/456,419

(22) Filed: Aug. 25, 2023

(65) Prior Publication Data

US 2024/0097044 A1     Mar. 21, 2024

(30) Foreign Application Priority Data

Sep. 20, 2022     (JP) ................................. 2022-148833

(51) Int. Cl.
| *H01B 12/00* | (2006.01) |
| *H10B 12/00* | (2023.01) |
| *H10D 30/67* | (2025.01) |

(52) U.S. Cl.
CPC ......... *H10D 30/6757* (2025.01); *H10B 12/05* (2023.02); *H10B 12/33* (2023.02); *H10D 30/6728* (2025.01); *H10D 30/6729* (2025.01); *H10D 30/6755* (2025.01)

(58) Field of Classification Search
CPC ........... H10D 30/6757; H10D 30/6708; H10D 30/6715; H10D 30/67; H10D 30/6728;

H10D 30/6729; H10D 30/6755; H10D 30/6734; H10D 86/423; H10D 86/40; H10D 86/60; H10B 12/05; H10B 12/00; H10B 12/33

See application file for complete search history.

(56) References Cited

U.S. PATENT DOCUMENTS

| 11,264,512 B2 | 3/2022 | Dewey |
| 2019/0296155 A1 | 9/2019 | Sawabe |
| 2020/0303554 A1 | 9/2020 | Sawabe |
| 2021/0167194 A1 | 6/2021 | Yamazaki |
| 2021/0257426 A1 | 8/2021 | Tanaka |

FOREIGN PATENT DOCUMENTS

JP          2019169490 A     10/2019

*Primary Examiner* — Nikolay K Yushin
(74) *Attorney, Agent, or Firm* — Kim & Stewart LLP

(57) ABSTRACT

According to one embodiment, a semiconductor device includes a first conductive layer between first and second insulating layers with an oxide semiconductor column extending in the first direction through these layers. A third insulating layer covers the column. The column has a first semiconductor portion at a first position matching the first insulating layer, a second semiconductor portion at a second position matching second insulating layer, and a third semi-conductor portion at a third position matching the first conductive layer. The first semiconductor portion is con-tinuous along a second direction between the third insulating layer, the second semiconductor portion is continuous along the second direction between the third insulating layer, but the third semiconductor portion is not continuous between the third insulating layer.

20 Claims, 30 Drawing Sheets

113

150

111

120

121

100

SEMICONDUCTOR DEVICE

CROSS-REFERENCE TO RELATED APPLICATION

This application is based upon and claims the benefit of priority from Japanese Patent Application No. 2022-148833, filed Sep. 20, 2022, the entire contents of which are incorporated herein by reference.

FIELD

Embodiments described herein relate generally to a semiconductor device.

BACKGROUND

A semiconductor device with a first insulating layer and a second insulating layer located in a first direction, a first conductive layer between the first insulating layer and the second insulating layer, and an oxide semiconductor layer extending in the first direction and facing the first insulating layer, the second insulating layer, and the first conductive layer is known.

DETAILED DESCRIPTION

Figure 1:
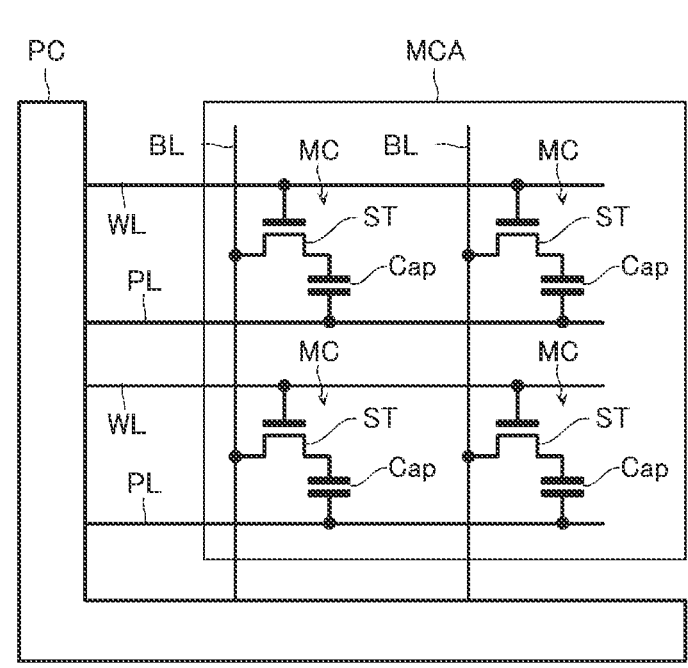
FIG. 1 is a schematic circuit diagram illustrating aspects of a semiconductor device according to a first embodiment.

Embodiments provide a semiconductor device that operates suitably.

In general, according to one embodiment, a semiconductor device includes a first insulating layer, a second insulating layer spaced from the first insulating layer in a first direction, a first conductive layer between the first insulating layer and the second insulating layer in the first direction, an oxide semiconductor layer extending in the first direction and facing the first insulating layer, the second insulating layer, and the first conductive layer in a second direction perpendicular to the first direction, and a third insulating layer that is between the first insulating layer and the oxide semiconductor layer, the second insulating layer and the oxide semiconductor layer, and the first conductive layer and the oxide semiconductor layer. The oxide semiconductor layer includes: a first semiconductor portion at a first position along the first direction corresponding to the first insulating layer, a second semiconductor portion at a second position along the first direction corresponding to the second insulating layer, and a third semiconductor portion at a third position along the first direction corresponding to the first conductive layer. In a first cross-section along in the first direction and the second direction, the first semiconductor portion is continuous along the second direction between opposite sides contacting the third insulating layer, the second semiconductor portion is continuous along the second direction between sides contacting the third insulating layer, but the third semiconductor portion is not continuous along the second direction between a first portion contacting the third insulating layer on one side of the third semiconductor portion and a second portion spaced in the second direction from the first portion and contacting the third semiconductor layer on an opposite side of the third semiconductor portion.

Hereinafter, a semiconductor device according to certain example embodiments will be described with reference to the drawings. The following embodiments are merely examples and are not intended to limit the present disclosure. The drawings are schematic, and partial configurations or the like may not be illustrated for convenience of description. In addition, components common to a plurality of embodiments will be represented by the same reference numerals, and the description thereof need not be repeated.

In the present specification, a first component "being electrically connected to" a second component may be a state where the first component is directly connected to the second component or a state where the first component is connected to the second component via a wiring, a semiconductor member, a transistor, or the like. For example, when three transistors are connected in series, even if the second transistor is in an OFF state, the first transistor can be said to be "electrically connected" to the third transistor.

In addition, in the present specification, a direction parallel to an upper surface of a substrate will be referred to as "X direction", a direction parallel to the upper surface of the substrate and perpendicular to the X direction will be referred to as "Y direction", and a direction perpendicular to the upper surface of the substrate will be referred to as "Z direction".

In addition, in the present specification, a direction parallel to a surface may be referred to as a "first direction", a direction parallel to the surface but intersecting with the first direction may be referred to as a "second direction", and a direction intersecting with the surface may be referred to as a "third direction". Each of the first direction, the second direction, and the third direction may or may not correspond to any of the X direction, the Y direction, or the Z direction.

In addition, in the present specification, an expression such as "upper" or "lower" is based on positional relationship relative to a substrate component or the like. For example, a direction going away from the substrate in the Z direction will be referred to as "upper" direction, and a direction going toward the substrate in the Z direction will be referred to as "lower" direction. In general, a lower surface or a lower end refers to a surface or an end portion on the substrate side, and an upper surface or an upper end refers to a surface or an end portion on a side opposite (or farthest away) from the substrate. A surface intersecting with the X direction or the Y direction may be referred to as "side surface" or the like.

First Embodiment

Circuit Configuration

A semiconductor device according to a first embodiment includes a memory cell array MCA and a peripheral circuit PC as illustrated in FIG. 1.

The memory cell array MCA includes a plurality of bit lines BL, a plurality of word lines WL, a plurality of plate lines PL, and a plurality of memory cells MC connected to the plurality of bit lines BL, the plurality of word lines WL, and the plurality of plate lines PL. A plurality of memory cells MC connected to the same word line WL are connected to different bit lines BL. A plurality of memory cells MC connected to the same bit line BL are connected to different word lines WL.

Each of the memory cells MC includes a select transistor ST and a capacitor Cap connected in series between a bit line BL and a plate line PL.

The select transistor ST is a field-effect transistor including a semiconductor layer that functions as a channel region, a gate insulating film, and a gate electrode. The word line WL is connected to each of the gate electrodes of the select transistors ST.

The capacitor Cap is a capacitor including a pair of electrodes and an insulating film therebetween. The capacitor Cap functions as a memory unit.

The peripheral circuit PC includes, for example, a voltage generation circuit that generates an operating voltage and outputs the generated operating voltage to a voltage supply line, a decoding circuit that electrically connects a desired voltage supply line to each of the relevant wirings (the bit lines BL, the word lines WL, and the plate lines PL) in the memory cell array MCA, and a sense amplifier circuit that detects a current or a voltage of the bit line BL.

Structure

Figure 2:
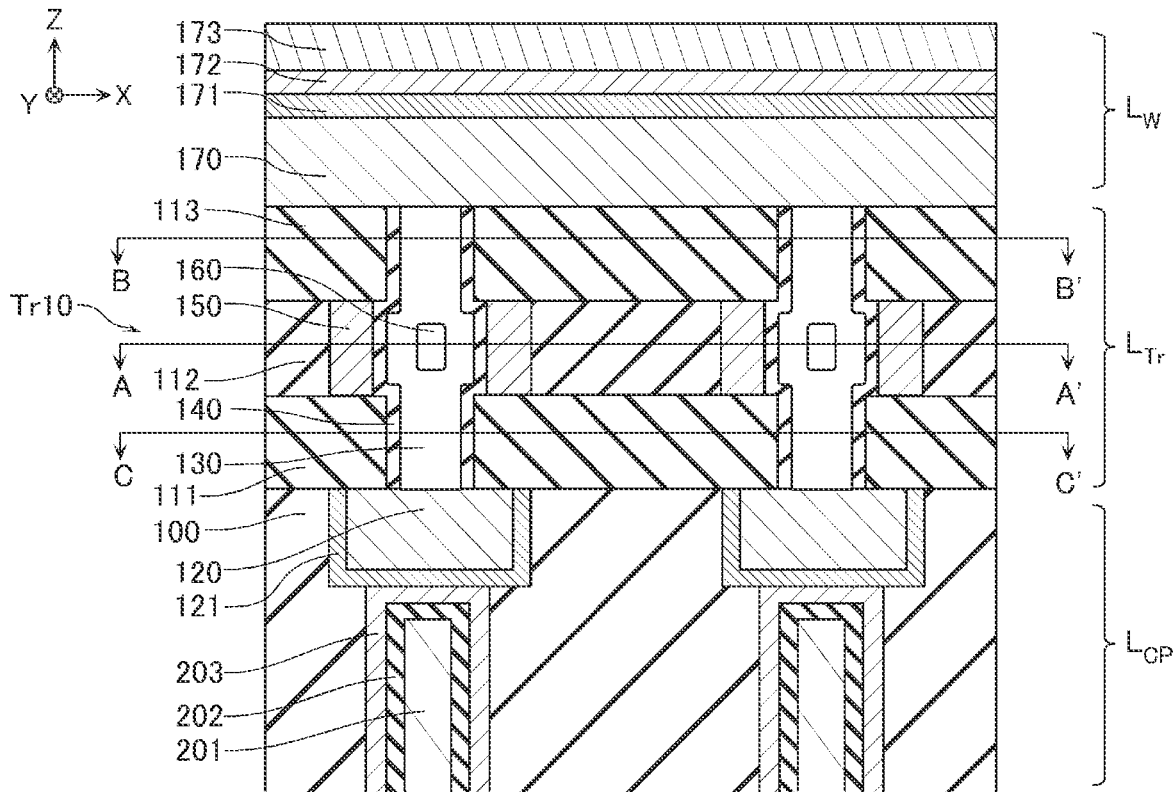
FIG. 2 is a schematic cross-sectional view illustrating aspects of a semiconductor device according to a first embodiment.
Figure 3:
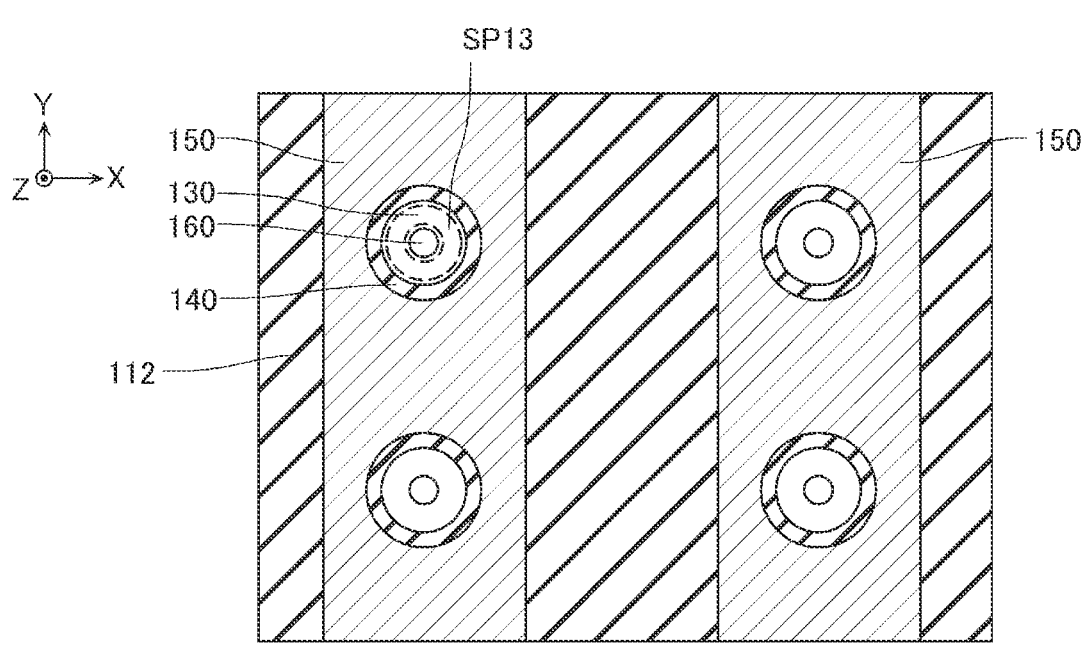
FIG. 3 is a schematic plan view illustrating aspects of a semiconductor device according to a first embodiment.
Figure 4:
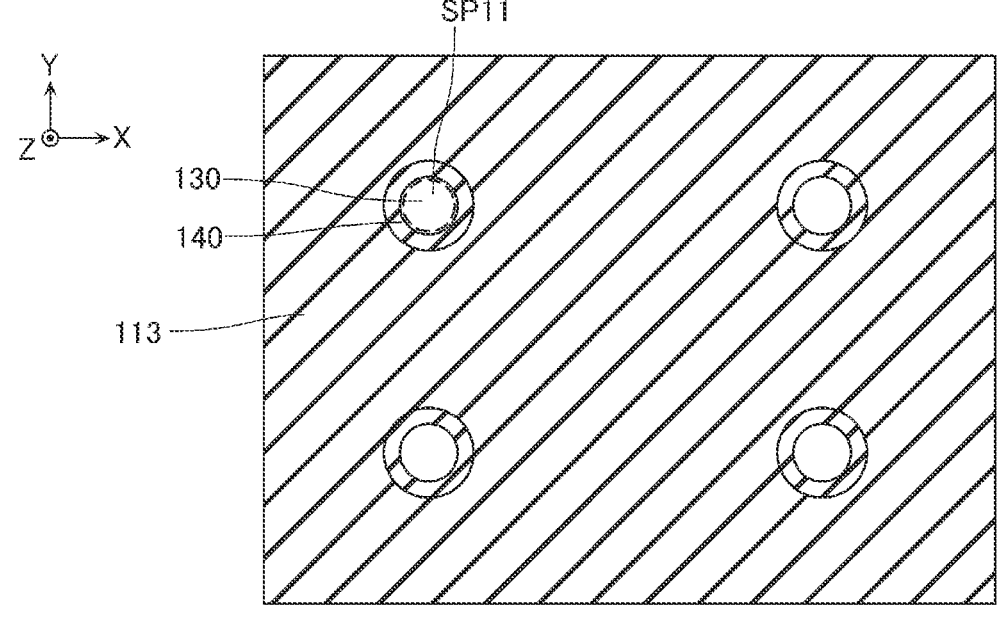
FIG. 4 is a schematic plan view aspects of a semiconductor device according to a first embodiment.
Figure 5:
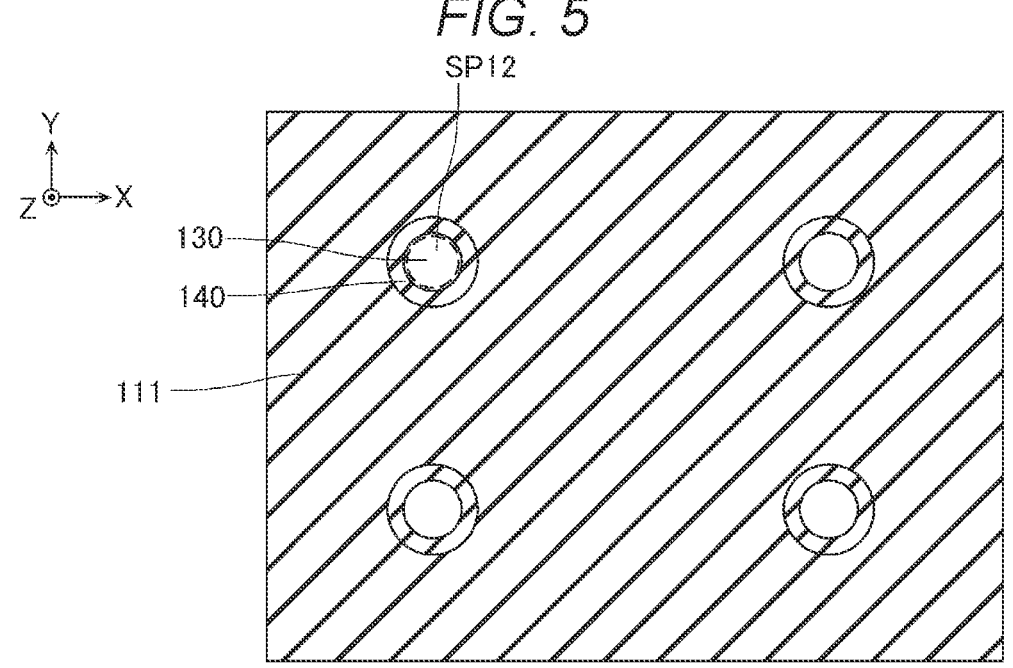
FIG. 5 is a schematic plan view aspects of a semiconductor device according to a first embodiment.

FIG. 2 is schematic XZ cross-sectional view illustrating a configuration of a part of the semiconductor device. FIG. 3 is a schematic XY cross-sectional view of the configuration illustrated in FIG. 2 taken along line A-A' and seen in the direction of the arrow. FIG. 4 is a schematic XY cross-sectional view of the configuration illustrated in FIG. 2 taken along line B-B' and seen in the direction of the arrow. FIG. 5 is a schematic XY cross-sectional view of the configuration illustrated in FIG. 2 taken along line A-A' and seen in the direction of the arrow.

The semiconductor device according to the first embodiment includes a transistor layer $L_{Tr}$, a capacitor layer $L_{CP}$ that is provided below the transistor layer $L_{Tr}$, and a wiring layer $L_W$ that is provided above the transistor layer $L_{Tr}$.

Transistor Layer $L_{Tr}$

For example, as illustrated in FIG. 2, the transistor layer $L_{Tr}$ includes: an insulating layer 111 provided on an upper surface of an insulating layer 100; and an insulating layer 113 provided above the insulating layer 111. In addition, the transistor layer $L_{Tr}$ includes a plurality of insulating layers 112 and a plurality of conductive layers 150 that are provided between the insulating layer 111 and the insulating layer 113 and alternately located in the X direction. In addition, as illustrated in FIG. 3, the transistor layer $L_{Tr}$ may include: a plurality of semiconductor layers 130 that are located in the X direction and the Y direction corresponding to the plurality of conductive layers 150; and an insulating layer 140 that is provided on an outer peripheral surface of the semiconductor layer 130. In addition, as illustrated in FIGS. 2 and 3, the transistor layer $L_{Tr}$ may include a cavity 160 that is provided in the semiconductor layer 130.

The insulating layer 100, the insulating layer 111, the insulating layer 112, and the insulating layers 113 comprise silicon oxide ($SiO_2$).

The semiconductor layer 130 is an oxide semiconductor and functions as, for example, a channel region of the select transistor ST (FIG. 1). The semiconductor layer 130 contains at least one element selected from the group consisting of indium (In), gallium (Ga), silicon (Si), aluminum (Al), and tin (Sn), zinc (Zn), and oxygen (O). The semiconductor layer 130 comprises, for example, indium (In), gallium (Ga), zinc (Zn), and oxygen (O).

The insulating layer 140 functions as, for example, the gate insulating film of the select transistor ST (FIG. 1). The insulating layer 140 is, for example, silicon oxide ($SiO_2$).

The conductive layer 150 functions as, for example, the gate electrodes of the plurality of select transistors ST located in the Y direction and the word line WL (FIG. 1) of the memory cell array MCA. The conductive layer 150 may be, for example, tungsten (W) or a stacked structure including titanium nitride (TiN) and tungsten (W).

For example, as illustrated in FIG. 2, the cavity 160 is provided in the semiconductor layer 130 at a position corresponding to the conductive layer 150 in the Z direction. An upper surface, a lower surface (FIG. 2), and a side surface (FIG. 3) of the cavity 160 are surrounded by the semiconductor layer 130. The cavity 160 refers to a so-called space or void that is surrounded by solid materials, and the cavity 160 does not include any of the surrounding solid materials. The cavity 160 is, for example, a space filled with air, gas, or the like such as a mixture of a plurality of gases such as nitrogen, oxygen, and/or noble gas, but is unfilled otherwise and may be referred to as unfilled even when containing air or gas. In some examples, cavity 160 may be substantially a vacuum or unfilled space.

Capacitor Layer $L_{CP}$

For example, as illustrated in FIG. 2, the capacitor layer $L_{CP}$ includes: a plurality of conductive layers 120 that are provided corresponding to the plurality of semiconductor layers 130 and are connected to lower ends of the plurality of semiconductor layers 130, respectively; and a plurality of conductive layers 121 that are provided corresponding to the plurality of conductive layers 120 and are provided on lower surfaces and outer peripheral surfaces of the plurality of conductive layers 120. In addition, the capacitor layer $L_{CP}$ includes: a plurality of conductive layers 201 that are provided corresponding to the plurality of conductive layers 120 and are provided below the plurality of conductive layers 120; an insulating layer 202 that is provided on an upper surface and an outer peripheral surface of the conductive layer 201; and a conductive layer 203 that is provided on an upper surface and an outer peripheral surface of the insulating layer 202.

The conductive layer 120 functions as, for example, a drain electrode of the select transistor ST (FIG. 1). The conductive layer 120 has a substantially circular shape in the XY cross-section and may have a plug shape. The conductive layers 120 contain at least one element selected from the group consisting of indium (In), tin (Sn), niobium (Nb), titanium (Ti), tungsten (W), ruthenium (Ru), tantalum (Ta), iridium (Ir), and molybdenum (Mo). The conductive layer 120 may be, for example, indium tin oxide (InSnO).

The conductive layers 121 may be, for example, titanium nitride (TiN).

The conductive layer 201 functions as one electrode of the capacitor Cap (FIG. 1). The conductive layer 201 comprises, for example, a stacked structure of titanium nitride (TiN) and tungsten (W). The conductive layer 201 is electrically connected to the plate line PL (FIG. 1).

The insulating layer 202 functions as an insulating layer between the electrodes of the capacitor Cap (FIG. 1). The insulating layer 202 can be silicon oxide ($SiO_2$). The insulating layer 202 may be, for example, alumina ($Al_2O_3$) or another insulating metal oxide.

The conductive layer 203 functions as the other electrode of the capacitor Cap (FIG. 1). The conductive layer 203 contains, for example, a stacked structure of titanium nitride (TiN) and tungsten (W). The conductive layer 203 is connected to an end surface of the conductive layers 121 on the lower side in the Z direction.

Wiring layer $L_W$

The wiring layer $L_W$ includes a conductive layer 170, a conductive layer 171, a conductive layer 172, and a conductive layer 173 that are provided in this order on an upper surface of the transistor layer $L_{Tr}$. The conductive layer 170, the conductive layer 171, the conductive layer 172, and the conductive layer 173 extend in the X direction, for example, as illustrated in FIG. 2, and plural sets thereof are located in the Y direction. The conductive layer 170, the conductive layer 171, the conductive layer 172, and the conductive layer 173 function as, for example, the source electrodes of the plurality of select transistors ST located in the X direction and the bit line BL (FIG. 1) of the memory cell array MCA. The conductive layer 170 contains, for example, the same material as the conductive layer 120. The conductive layer 171 contains, for example, titanium nitride (TiN). The conductive layer 172 contains, for example, tungsten (W). The conductive layer 173 contains, for example, aluminum (Al).

Shapes of Semiconductor Layer 130, Insulating Layer 140, and Cavity 160

Figure 6:
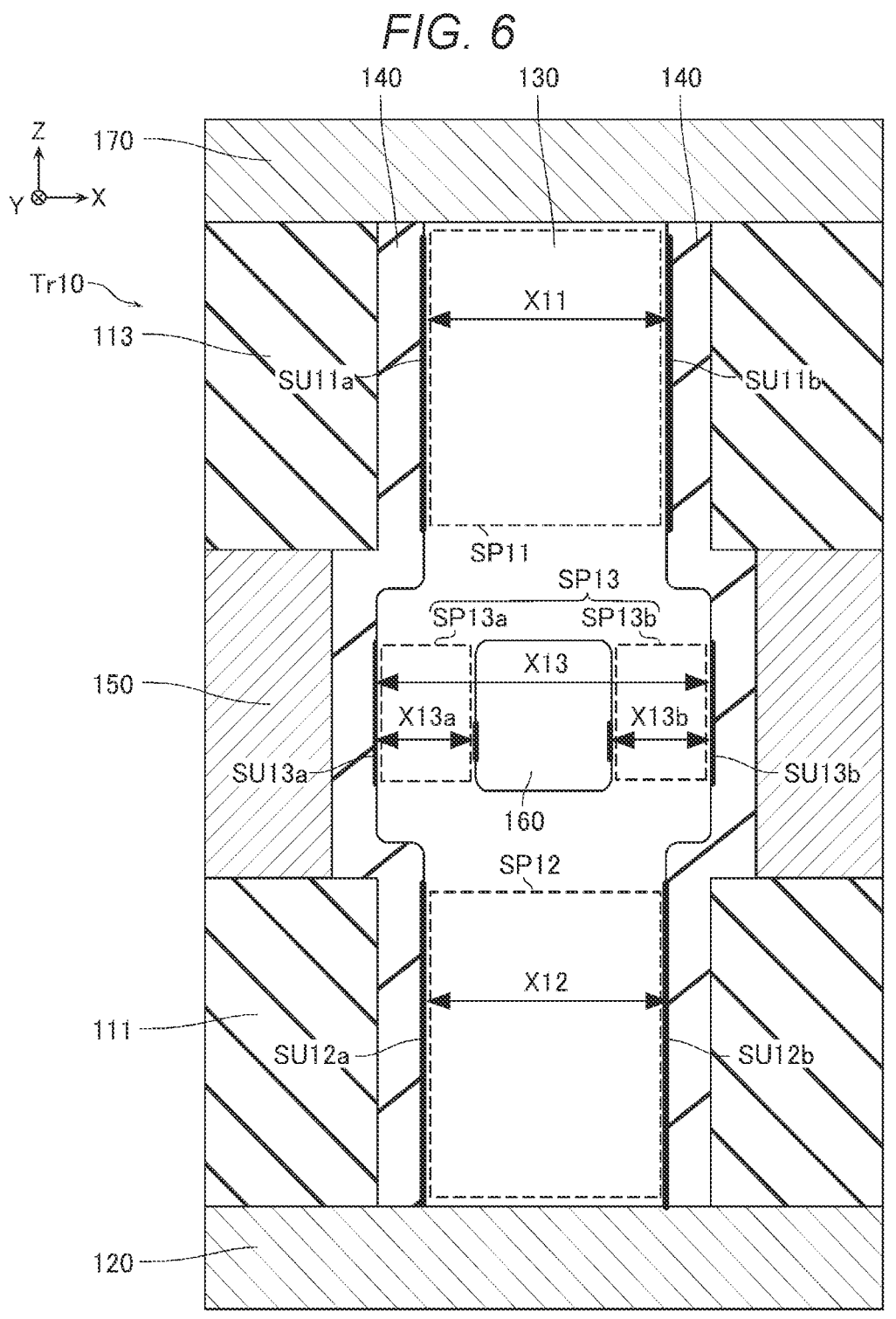
FIG. 6 is a schematic cross-sectional view illustrating aspects of a semiconductor device according to a first embodiment.

Next, the shapes the semiconductor layer 130, the insulating layer 140, and the cavity 160 will be described with reference to FIGS. 3 to 6. In the following description, the configuration for implementing the select transistor ST (FIG. 1) will also be referred to as "transistor structure Tr10". FIG. 6 is a schematic XZ cross-sectional view illustrating a configuration of a part of the transistor structure Tr10. FIG. 6 illustrates the XZ cross-section. Even when observing a cross-section (for example, an YZ cross-section) other than the XZ cross-section taken along the central axis of the semiconductor layer 130, the same structure as that of FIG. 6 is observed.

For example, as illustrated in FIGS. 3 to 6, the semiconductor layer 130 includes: a substantially columnar semiconductor portion SP11 (FIGS. 4 and 6) that is provided at a position corresponding to the insulating layer 113 in the Z direction; a substantially columnar semiconductor portion SP12 (FIGS. 5 and 6) that is provided at a position corresponding to the insulating layer 111 in the Z direction; and a substantially cylindrical semiconductor portion SP13 (FIGS. 3 and 6) that is provided at a position corresponding to the conductive layer 150 in the Z direction.

In the XZ cross-section illustrated in FIG. 6, the semiconductor portion SP11 includes a surface SU11a that is in contact with the insulating layer 140 and a surface SU11b that is in contact with the insulating layer 140 on the opposite side of the semiconductor portion SP11. For the semiconductor portion SP11, in the XZ cross-section illustrated in FIG. 6, no cavity is present between the surface SU11a to the surface SU11b in the X direction. The semiconductor portion SP11 may be referred to as continuously provided along the X direction in this context since no other material or cavity is present. The upper surface of the semiconductor portion SP11 is substantially circular and is connected to the conductive layer 170.

In the XZ cross-section illustrated in FIG. 6, the semiconductor portion SP12 includes a surface SU12a that is in contact with the insulating layer 140 and a surface SU12b that is in contact with the insulating layer 140 on the opposite side of the semiconductor portion SP12. For the semiconductor portion SP12, in the XZ cross-section illustrated in FIG. 6, the distance from the surface SU12a to the surface SU12b is constant and there is no portion of cavity 160 present along the X direction between the sidewalls (surface SU12a and surface SU12b). The semiconductor portion SP12 may thus be said to be continuously provided or continuous in the range between the sidewalls in the X direction. The lower surface of the semiconductor portion SP12 is substantially circular and is connected to the conductive layer 120.

For example, in the XZ cross-section illustrated in FIG. 6, the semiconductor portion SP13 includes a portion SP13a and a portion SP13b spaced from each other in the X direction. The cavity 160 is provided between the portion SP13$a$ and the portion SP13$b$. The portion SP13$a$ includes a surface SU13$a$ that is in contact with the insulating layer 140. The portion SP13$b$ includes a surface SU13$b$ that is in contact with the insulating layer 140 on the opposite side of the semiconductor portion SP13. For the semiconductor portion SP13, in the XZ cross-section illustrated in FIG. 6, from the distance between the surface SU13$a$ to the surface SU13$b$ is constant, but the cavity 160 is present inside the semiconductor portion SP13 making the material of the semiconductor portion SP13 non-continuous along the X direction in the range from sidewall to sidewall.

A distance from the surface SU11$a$ to the surface SU11$b$ will be referred to as a distance X11. A distance from the surface SU12$a$ to the surface SU12$b$ will be referred to as a distance X12. A distance from the surface SU13$a$ to the surface SU13$b$ will be referred to as a distance X13. The distance X13 is more than the distance X11 and the distance X12.

A width of the portion SP13$a$ in the X direction will be referred to as a width X13$a$. A width of the portion SP13$b$ in the X direction will be referred to as a width X13$b$. The width X13$a$ and the width X13$b$ are less than the distance X11 and the distance X12. In addition, the sum of the width X13$a$ and the width X13$b$ is less than the distance X11 and the distance X12.

Manufacturing Method According to First Embodiment

Next, a method of manufacturing the semiconductor device according to the embodiment will be described with reference to FIGS. 7 to 14. FIGS. 7 to 14 are schematic cross-sectional views illustrating the method of manufacturing the semiconductor device according to the first embodiment.

Figure 7:
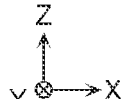
FIGS. 7 to 14 depict aspects of a method of manufacturing a semiconductor device according to a first embodiment.
Figure 7:
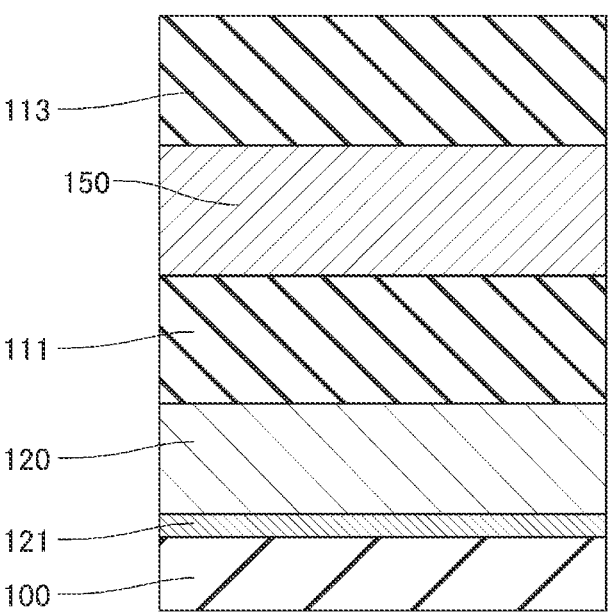

In the manufacturing method, as illustrated in FIG. 7, the insulating layer 100, the conductive layers 121, the conductive layer 120, the insulating layer 111, the conductive layer 150, the insulating layer 113 are formed in this order above a lower substrate. This step is performed by, for example, chemical vapor deposition (CVD) or the like.

Figure 8:
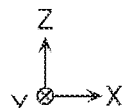
Figure 8:
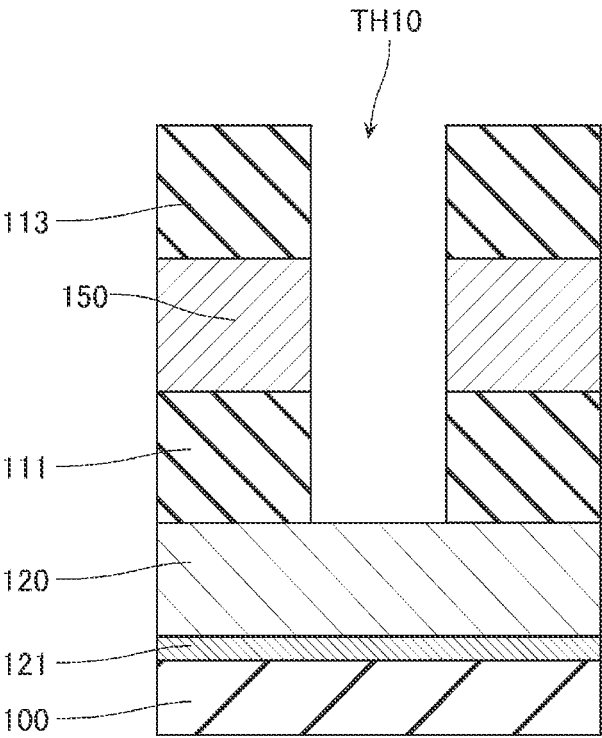

Next, as illustrated in FIG. 8, an opening TH10 is formed. The opening TH10 extends in the Z direction, penetrates the insulating layer 113, the conductive layer 150, and the insulating layer 111, and exposes the conductive layer 120. This step is performed by, for example, reactive ion etching (RIE).

Figure 9:
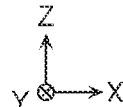
Figure 9:
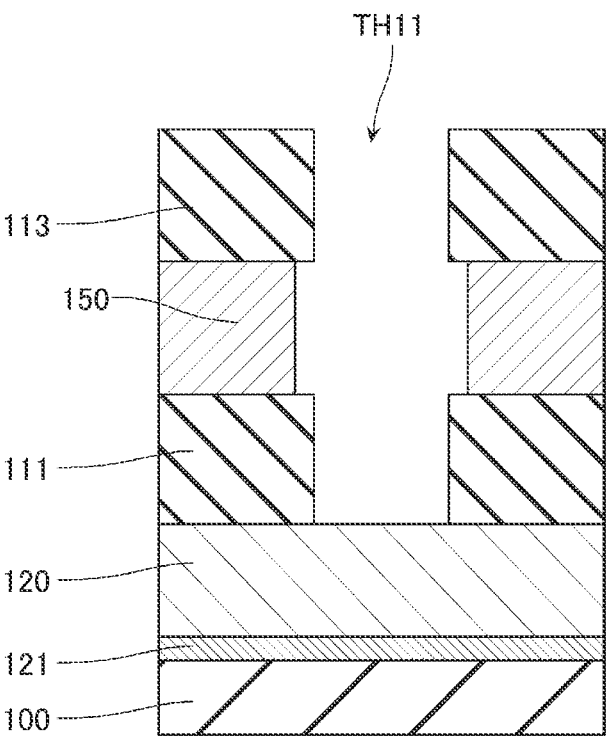

Next, as illustrated in FIG. 9, a portion of the conductive layer 150 exposed to the opening TH10 is removed by a predetermined amount such that an opening TH11 is formed. After this step, the opening size (diameter) of the opening TH11 at a height position of the conductive layer 150 is wider than that at height positions of the insulating layer 111 and the insulating layer 113. This step is performed by, for example, wet etching or chemical dry etching (CDE).

Figure 10:
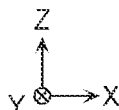
Figure 10:
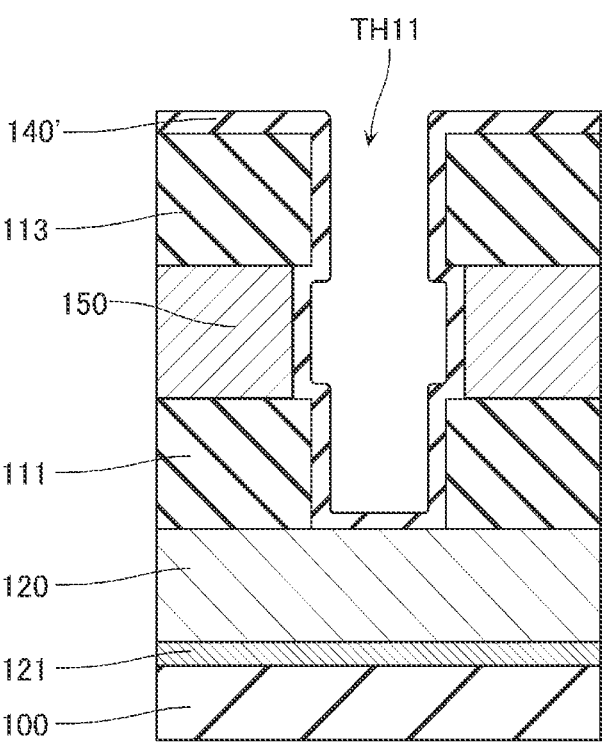

Next, as illustrated in FIG. 10, an insulating layer 140' is formed on an upper surface of the insulating layer 113 and an inner side surface and a bottom surface of the opening TH11. The insulating layer 140' can be the same material as the insulating layer 140. This step is performed by, for example, atomic layer deposition (ALD) or CVD.

Figure 11:
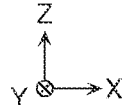
Figure 11:
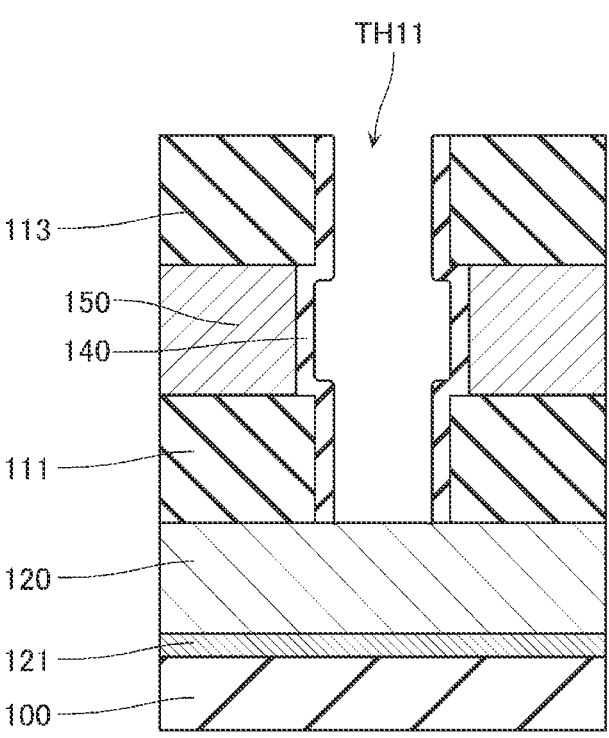

Next, as illustrated in FIG. 11, the portion of insulating layer 140' formed on the upper surface of the insulating layer 113 and at the bottom surface of the opening TH11 is removed such that the insulating layer 140 is left on the inner side surface of the opening TH11. In this step, the conductive layer 120 is exposed at the bottom surface of the opening TH11. This step is performed by, for example, RIE.

Figure 12:
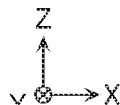
Figure 12:
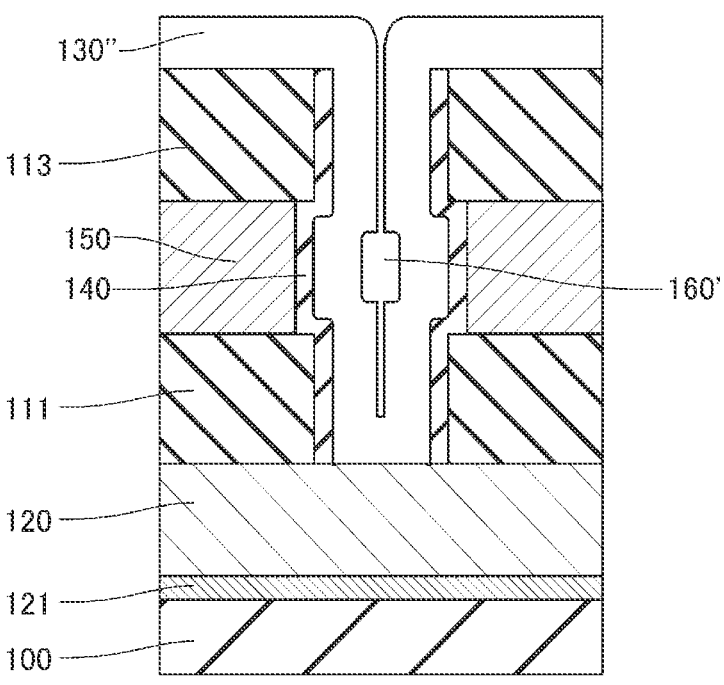
Figure 13:
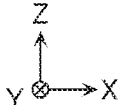
Figure 13:
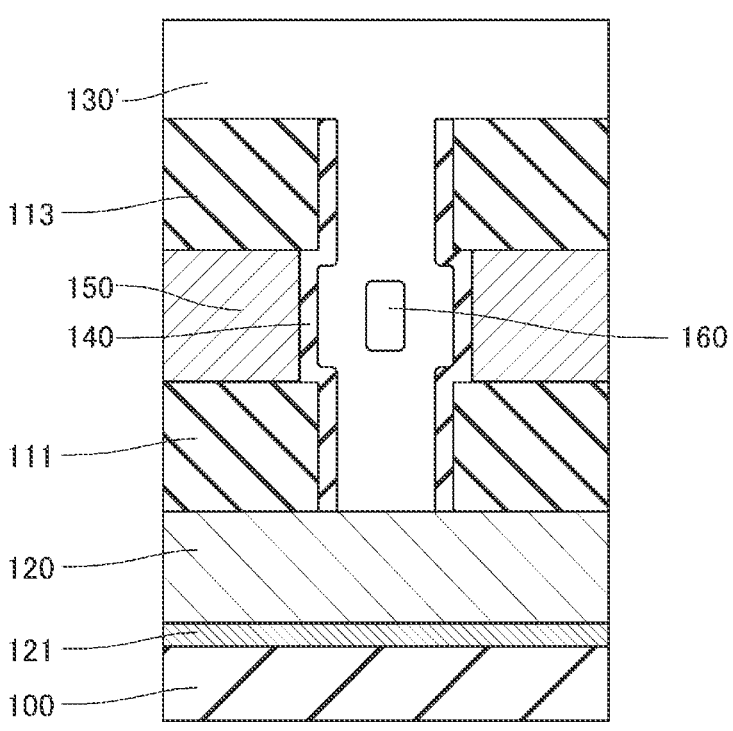

Next, as illustrated in FIGS. 12 and 13, a semiconductor layer 130' is formed in the opening TH11 and on the upper surface of the insulating layer 113. FIG. 12 illustrates a semiconductor layer 130'' which is an intermediate stage before the semiconductor layer 130' illustrated in FIG. 13 forms. The semiconductor layer 130'' and the semiconductor layer 130' are the same material as the semiconductor layer 130. This step is performed by, for example, ALD or CVD. As illustrated in FIG. 12, in this film forming method, the semiconductor layer 130'' is first formed inside and outside the opening TH11 with a relatively uniform film thickness (conformally). As a result, at the height position of the conductive layer 150 in the opening TH11, the opening size is relatively wide. Therefore, a cavity 160' is left. When the film formation processing further continues from this state (FIG. 12), the upper side and the lower side of the cavity 160' are gradually embedded and blocked such that the cavity 160 (FIG. 13) is formed.

Figure 14:
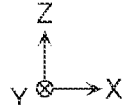
Figure 14:
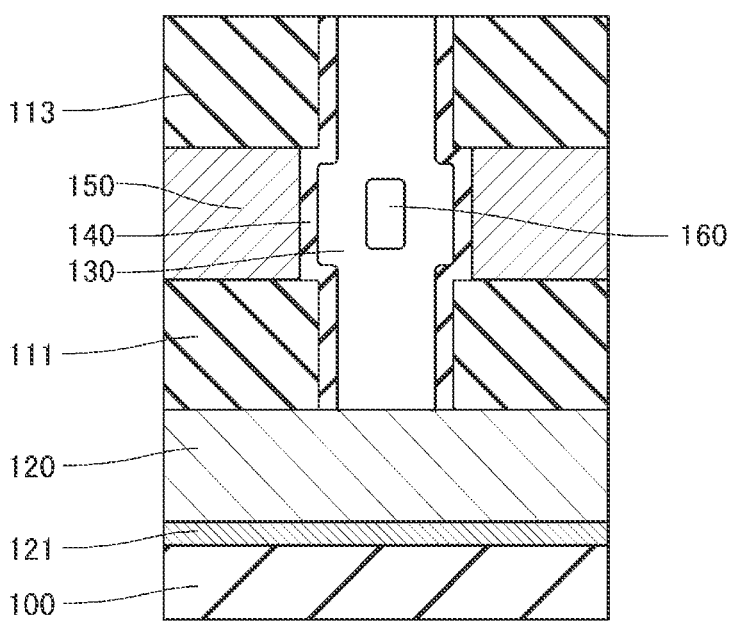

Next, as illustrated in FIG. 14, the portion of the semiconductor layer 130' that is formed outside the opening TH11 is removed and planarized to form the semiconductor layer 130. This step is performed by, for example, chemical mechanical planarization (CMP).

Next, by forming the conductive layer 170, the conductive layer 171, the conductive layer 172 (see FIG. 2), and the conductive layer 173 (FIG. 2) on the upper surface of the structure illustrated in FIG. 14, the semiconductor device according to the first embodiment is manufactured.

Comparative Example 1

Figure 15:
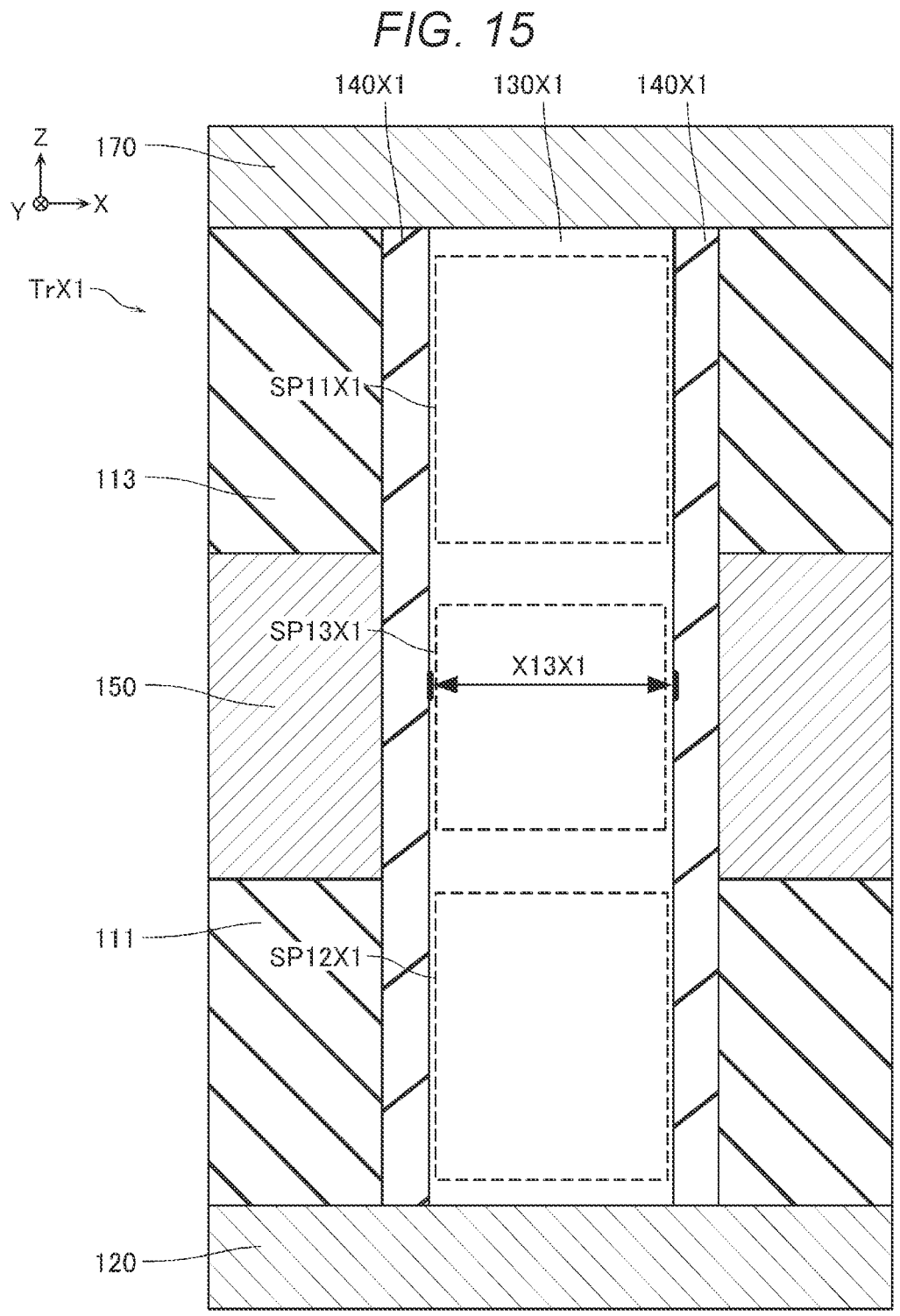
FIG. 15 is a schematic cross-sectional view illustrating a configuration of a part of a semiconductor device according to Comparative Example 1.

Next, a semiconductor device according to Comparative example 1 will be described with reference to FIG. 15. FIG. 15 is a schematic cross-sectional view illustrating the semiconductor device according to Comparative Example 1.

The semiconductor device according to Comparative Example 1 has a transistor structure TrX1. The transistor structure TrX1 includes a semiconductor layer 130X1 and an insulating layer 140X1. The cavity 160 is not provided in the transistor structure TrX1.

As illustrated in FIG. 15, the semiconductor layer 130X1 includes, in the Z direction, a substantially columnar semiconductor portion SP11X1 that is provided at a position corresponding to the insulating layer 113, a substantially columnar semiconductor portion SP12X1 that is provided at a position corresponding to the insulating layer 111, and a substantially columnar semiconductor portion SP13X1 that is provided at a position corresponding to the conductive layer 150.

In the XZ cross-section illustrated in FIG. 15, the semiconductor portion SP11X1, the semiconductor portion SP12X1, and the semiconductor portion SP13X1 are continuously and uniformly provided in the range from one surface to the opposite surface in the X direction.

In addition, widths of the semiconductor portion SP11X1, the semiconductor portion SP12X1, and the semiconductor portion SP13X1 in the X direction are substantially the same and will each be referred to as a width X13X1.

In the semiconductor device according to Comparative Example 1, the film thickness of a channel portion (the semiconductor portion SP13X1) facing the conductive layer 150 that functions as the gate electrode of the transistor structure TrX1 is the width X13X1. In a transistor structure X1 that includes the channel portion having a relatively large film thickness as described above, a threshold voltage of the transistor is relatively low and the threshold voltage may be a negative value.

Comparative Example 2

Figure 16:
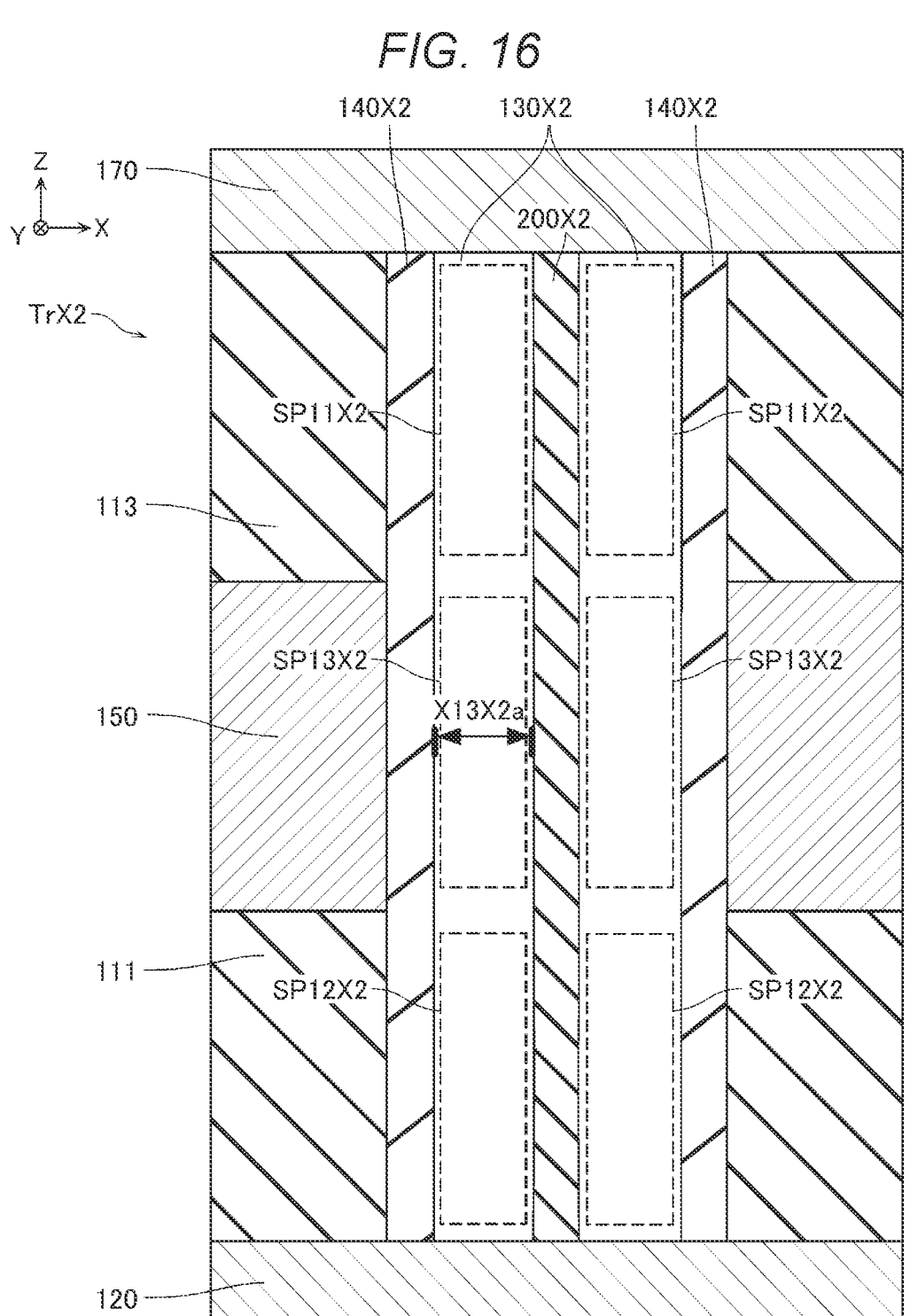
FIG. 16 is a schematic cross-sectional view illustrating a configuration of a part of a semiconductor device according to Comparative Example 2.

Next, a semiconductor device according to Comparative example 2 will be described with reference to FIG. 16. FIG. 16 is a schematic cross-sectional view illustrating the semiconductor device according to Comparative Example 2.

The semiconductor device according to Comparative Example 2 has a transistor structure TrX2. The transistor structure TrX2 includes a semiconductor layer 130X2 and an insulating layer 140X2. In addition, the transistor structure TrX2 includes an insulating layer 200X2 inside the semiconductor layer 130X2. In the insulating layer 200X2, an outer peripheral surface is in contact with the semiconductor layer 130X2, an upper surface is in contact with the conductive layer 170, and a lower surface is in contact with the conductive layer 120. The cavity 160 is not provided in the transistor structure TrX2.

As illustrated in FIG. 16, the semiconductor layer 130X2 includes, in the Z direction, a substantially cylindrical semiconductor portion SP11X2 that is provided at a position corresponding to the insulating layer 113, a substantially cylindrical semiconductor portion SP12X2 that is provided at a position corresponding to the insulating layer 111, and a substantially cylindrical semiconductor portion SP13X2 that is provided at a position corresponding to the conductive layer 150.

Widths in the X direction from outer peripheral surfaces to inner peripheral surfaces of the semiconductor portion SP11X2, the semiconductor portion SP12X2, and the semiconductor portion SP13X2 will be referred to as a width X13X2a. Accordingly, a shape of a contact surface between the conductive layer 120 functioning as a drain electrode and the semiconductor portion SP12X2 in the transistor structure TrX2 is a substantially annular shape having the width X13X2a. In addition, a shape of a contact surface between the conductive layer 170 functioning as a source electrode and the semiconductor portion SP12X2 in the transistor structure TrX2 is a substantially annular shape having the width X13X2a.

This way, in the semiconductor device according to Comparative Example 2, a contact portion between the conductive layers 120 and 170 and the semiconductor layer 130X2 is substantially annular. Therefore, the contact area is relatively small, and the contact resistance between the conductive layers 120 and 170 and the semiconductor layer 130X2 may be relatively large.

Effects

In the semiconductor device according to the first embodiment, the film thickness of the channel portion facing the conductive layer 150 that functions as the gate electrode of the transistor structure Tr10 (FIG. 6) is the width X13a. In the transistor structure Tr10 that includes the channel portion having a relatively small film thickness as described above, the threshold voltage of the transistor can be made relatively high and can be made a positive value.

In addition, in the semiconductor device according to the first embodiment, the shape of the contact surface between the conductive layer 120 functioning as the drain electrode and the semiconductor portion SP12 in the transistor structure Tr10 (FIG. 6) is the substantially circular shape having a diameter of the distance X12. In addition, the shape of the contact surface between the conductive layer 170 functioning as the source electrode and the semiconductor portion SP11 in the transistor structure Tr10 (FIG. 6) is the substantially circular shape having a diameter of the distance X11. This way, in the semiconductor device according to the first embodiment, the contact surface between the conductive layers 120 and 170 and the semiconductor layer 130 functioning as the channel is substantially circular, and the contact area can be made relatively wide. As a result, the contact resistance between the conductive layers 120 and 170 and the semiconductor layer 130 can be made relatively low.

Accordingly, in this configuration, a semiconductor device that operates suitably can be provided.

First Modification Example of First Embodiment

Figure 17:
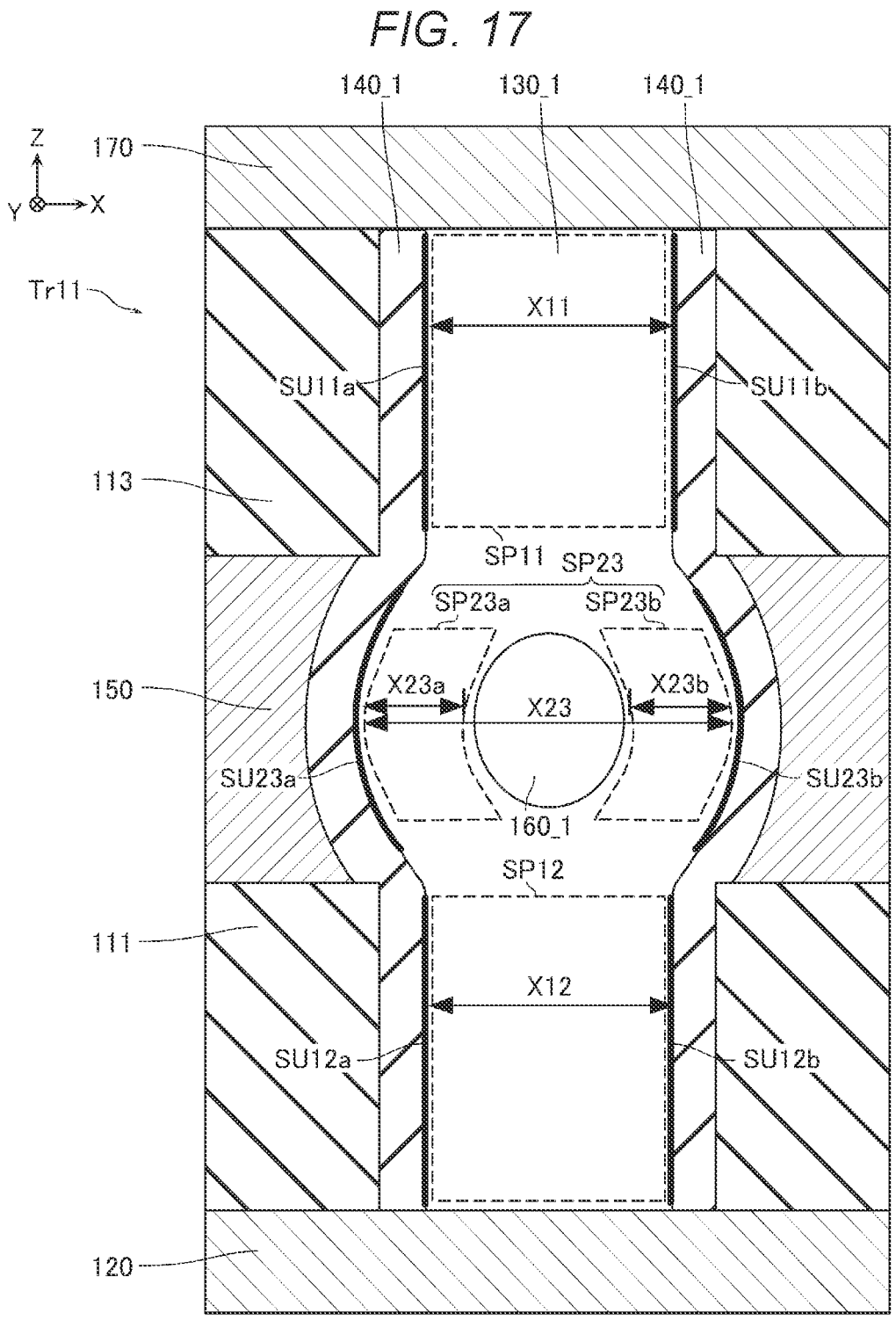
FIG. 17 is a schematic cross-sectional view illustrating aspects of a first modification example of a semiconductor device according to a first embodiment.

Next, a first modification example of the semiconductor device according to the first embodiment will be described with reference to FIG. 17. FIG. 17 is a schematic cross-sectional view illustrating a configuration of a part of the semiconductor device according to the modification example. FIG. 17 illustrates the XZ cross-section. However, even when a cross-section (for example, an YZ cross-section) other than the XZ cross-section taken along the central axis of the semiconductor layer 130_1, the same structure as that of FIG. 17 is observed. The semiconductor device according to this modification example includes, for example, a transistor structure Tr11 illustrated in FIG. 17.

Transistor Structure Tr11

Basically, the transistor structure Tr11 has the same configuration as the transistor structure Tr10 (FIG. 6). However, in the transistor structure Tr11 (FIG. 17), the semiconductor layer 130_1, an insulating layer 140_1, and a cavity 160_1 are provided instead of the semiconductor layer 130, the insulating layer 140, and the cavity 160 (FIG. 6). The semiconductor layer 130_1 and the insulating layer 140_1 include, for example, the same materials as the semiconductor layer 130 and the insulating layer 140. The cavity 160_1 is an unfilled space like the cavity 160.

Basically, the semiconductor layer 130_1 has the same configuration as the semiconductor layer 130. However, the semiconductor layer 130_1 includes a semiconductor portion SP23 that is provided at a position corresponding to the conductive layer 150 instead of the semiconductor portion SP13.

For example, in the XZ cross-section illustrated in FIG. 17, the semiconductor portion SP23 includes a portion SP23a and a portion SP23b spaced from each other in the X direction. The portion SP23a includes a surface SU23a that is in contact with the insulating layer 140_1. In the XZ cross-section illustrated in FIG. 17, the surface SU23a is a curved surface that is convex on the negative side in the X direction. That is, in the XZ cross-section illustrated in FIG. 17, each of points configuring the surface SU23a is provided on the negative side in the X direction when approaching a predetermined height position. In addition, in the XZ cross-section illustrated in FIG. 17, a direction of a tangent line at each of the points configuring the surface SU23a approaches the Z direction as a contact point approaches the predetermined height position. The portion SP23b includes a surface SU23b that is the other surface in the X direction and is in contact with the insulating layer 140_1. In the XZ cross-section illustrated in FIG. 17, the surface SU23b is a curved surface that is convex on the positive side in the X direction. That is, in the XZ cross-section illustrated in FIG. 17, each of points configuring the surface SU23b is provided on the positive side in the X direction when approaching a predetermined height position. In addition, in the XZ cross-section illustrated in FIG. 17, a direction of a tangent line at each of the points configuring the surface SU23*b* approaches the Z direction as a contact point approaches the predetermined height position. In the semiconductor portion SP23, for example, in the XZ cross-section illustrated in FIG. 17, a range from the surface SU23*a* to the surface SU23*b* is not continuous. The cavity 160_1 is provided between the portion SP23*a* and the portion SP23*b*. A boundary surface between the cavity 160_1 and the semiconductor layer 130_1 may be substantially parallel to a curved surface along the surfaces SU23*a* and SU23*b*.

In the XZ cross-section illustrated in FIG. 17, a distance from the surface SU23*a* to the surface SU23*b* in the X direction at the predetermined height position (the height position where the distance from the surface SU23*a* to the surface SU23*b* in the X direction is the maximum) will be referred to as a distance X23. The distance X23 is more than the distance X11 and the distance X12.

A width of the portion SP23*a* in the X direction will be referred to as a width X23*a*. A width of the portion SP23*b* in the X direction will be referred to as a width X23*b*. The width X23*a* and the width X23*b* are less than the distance X11 and the distance X12. In addition, the sum of the width X23*a* and the width X23*b* is less than the distance X11 and the distance X12.

Figure 18:
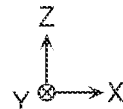
FIG. 18 is a schematic cross-sectional view illustrating aspects of a manufacturing method according to a first modification example.
Figure 18:
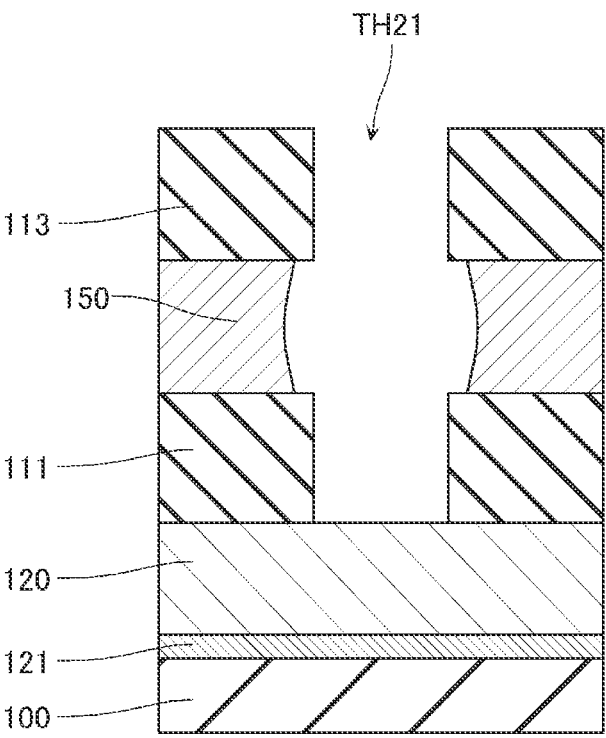

Manufacturing Method According to First Modification Example of First Embodiment Next, a method of manufacturing the first modification example of the semiconductor device according to the first embodiment will be described with reference to FIGS. 18 and 19.

Basically, the semiconductor device according to the first modification example of the first embodiment is manufactured using the same method as that of the semiconductor device according to the first embodiment. However, in the method of manufacturing the semiconductor device according to the modification example, in a step corresponding to the step described above with reference to FIGS. 8 and 9, an opening TH21 is formed as illustrated in FIG. 18. The opening TH21 extends in the Z direction, penetrates the insulating layer 113, the conductive layer 150, and the insulating layer 111, and exposes the conductive layer 120. This step is performed by, for example, RIE. In this step, a part of the insulating layer 113, a part of the conductive layer 150, and a part of the insulating layer 111 are removed in this order. In addition, the removal of the part of the conductive layer 150 is performed under a condition where the conductive layer 150 formed of tungsten (W) or the like is more likely to be removed than the insulating layer 111 and the insulating layer 113 formed of silicon oxide (SiO$_2$) or the like. At this time, on an exposed surface of the conductive layer 150 through the opening TH21, a curved surface that is convex in a direction away from the central axis of the opening TH21 is formed.

Next, for example, a step corresponding to the step described above with reference to FIGS. 10 and 11 is performed.

Figure 19:
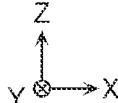
FIG. 19 is a schematic cross-sectional view illustrating aspects of a manufacturing method according to a first modification example.
Figure 19:
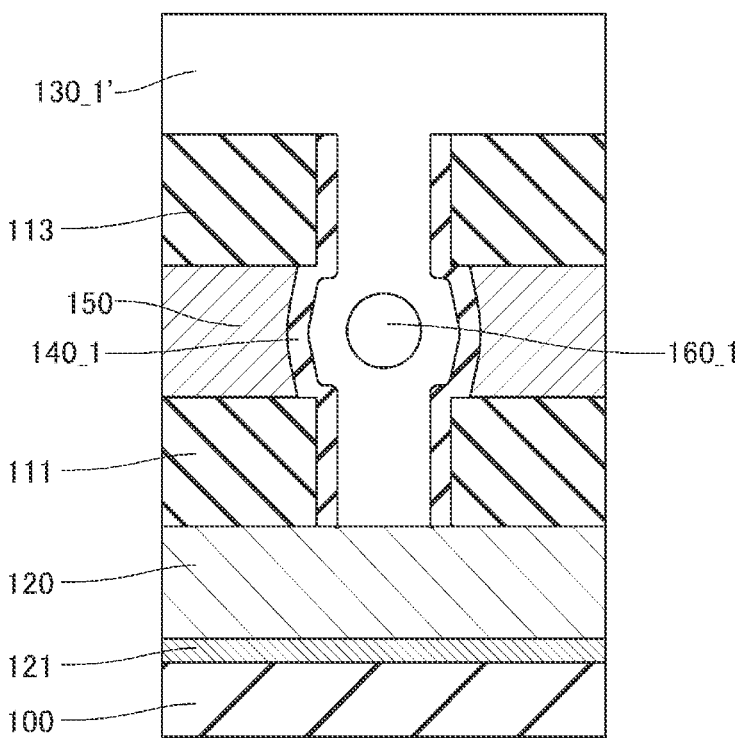

Next, for example, as illustrated in FIG. 19, a semiconductor layer 130_1' is formed in the opening TH21 and on the upper surface of the insulating layer 113. The semiconductor layer 130_1' can be the same material as the semiconductor layer 130. This step is performed by, for example, ALD or CVD. As illustrated in FIG. 19, in this film forming method, the semiconductor layer 130_1' is formed inside and outside the opening TH21 with a relatively uniform film thickness. As a result, the cavity 160_1 is formed along the curved surface formed in the inner side surface of the conductive layer 150.

Next, for example, by performing a step corresponding to the step described with reference to FIG. 14 to form the conductive layer 170, the conductive layer 171, the conductive layer 172, and the conductive layer 173 on the upper surface of the structure illustrated in FIG. 14, the semiconductor device according to the modification example is manufactured.

Second Modification Example of First Embodiment

Figure 20:
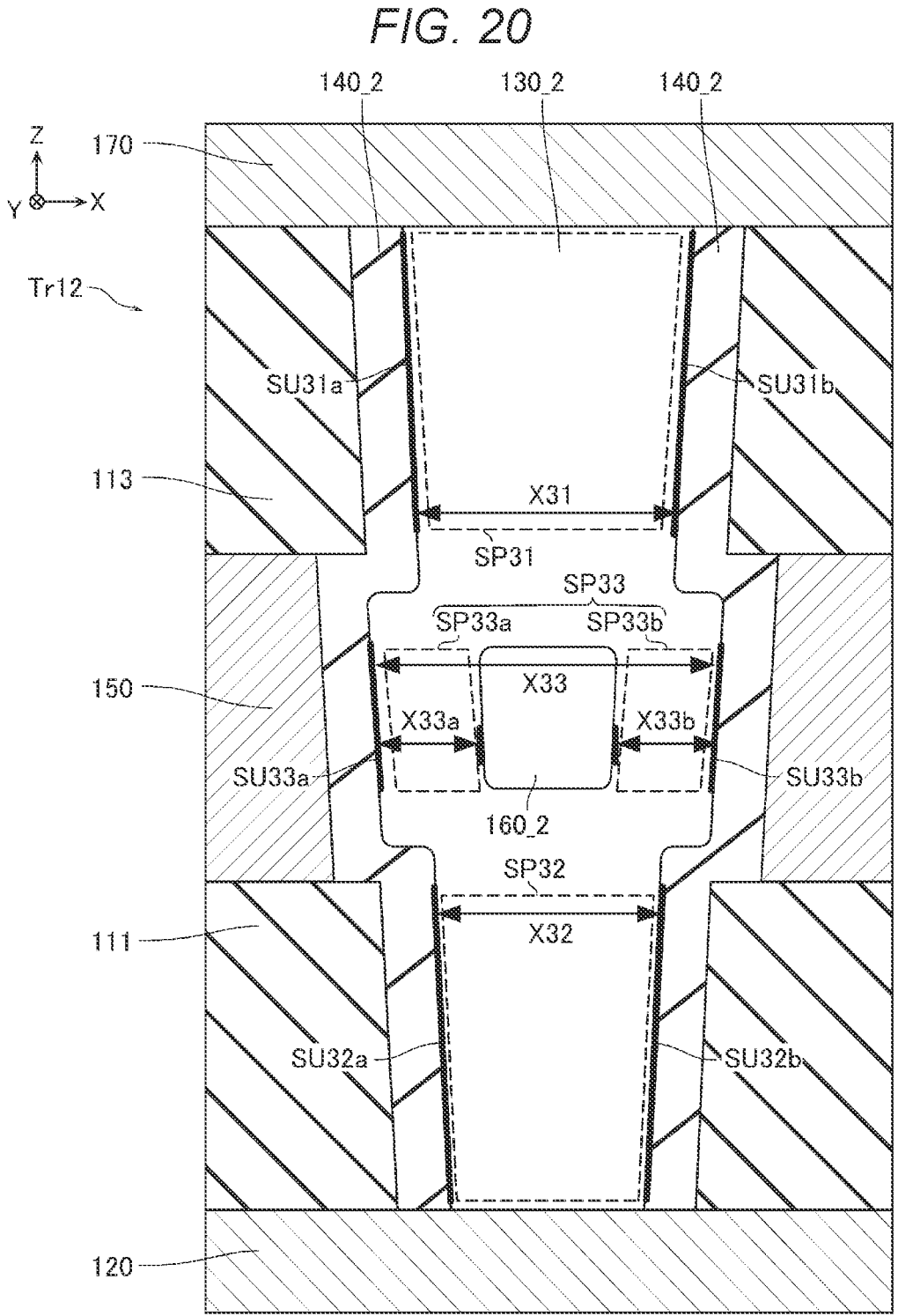
FIG. 20 is a schematic cross-sectional view illustrating aspects of a second modification example of a semiconductor device according to a first embodiment.

Next, a second modification example of the semiconductor device according to the first embodiment will be described with reference to FIG. 20. FIG. 20 is a schematic cross-sectional view illustrating a configuration of a part of the semiconductor device according to the modification example. FIG. 20 illustrates the XZ cross-section. Even when observing a cross-section (for example, an YZ cross-section) other than the XZ cross-section taken along the central axis of a semiconductor layer 130_2, the same structure as that of FIG. 20 is observed. The semiconductor device according to the modification example includes, for example, a transistor structure Tr12 illustrated in FIG. 20.

Transistor Structure Tr12

Basically, the transistor structure Tr12 has the same configuration as the transistor structure Tr10 (FIG. 6). However, in the transistor structure Tr12 (FIG. 20), the semiconductor layer 130_2, an insulating layer 140_2, and a cavity 160_2 illustrated in FIG. 20 are provided instead of the semiconductor layer 130, the insulating layer 140, and the cavity 160 (FIG. 6). The semiconductor layer 130_2 and the insulating layer 140_2 include, for example, the same materials as the semiconductor layer 130 and the insulating layer 140. The cavity 160_2 is an unfilled space like the cavity 160.

Basically, the semiconductor layer 130_2 has the same configuration as the semiconductor layer 130. However, the semiconductor layer 130_2 includes a semiconductor portion SP31, a semiconductor portion SP32, and a semiconductor portion SP33 instead of the semiconductor portion SP11, the semiconductor portion SP12, and the semiconductor portion SP13. In each of the semiconductor portion SP31, the semiconductor portion SP32, and the semiconductor portion SP33, for example, as illustrated in FIG. 20, the width in the X direction (the width in the radial direction) decreases toward the negative side in the Z direction.

For example, in the XZ cross-section illustrated in FIG. 20, the semiconductor portion SP31 includes a surface SU31*a* that is in contact with the insulating layer 140 and a surface SU31*b* that is in contact with the insulating layer 140 on the opposite side of the semiconductor portion SP31. For the semiconductor portion SP31, in the XZ cross-section illustrated in FIG. 20, the distance from the surface SU31*a* to the surface SU31*b* is not constant, but there is no cavity disposed in this portion.

In the XZ cross-section illustrated in FIG. 20, the semiconductor portion SP32 includes a surface SU32*a* that is in contact with the insulating layer 140 and a surface SU32*b* that is in contact with the insulating layer 140 on the opposite side of the semiconductor portion SP32. For the semiconductor portion SP32, in the XZ cross-section illustrated in FIG. 20, the distance from the surface SU32*a* to the surface SU32*b* is not constant.

In the XZ cross-section illustrated in FIG. 20, the semiconductor portion SP33 includes a portion SP33*a* and a portion SP33b spaced from each other in the X direction. A cavity 160_2 is provided between the portion SP33a and the portion SP33b. The width of cavity 160_2 in the X direction (the dimension in the radial direction) decreases (tapers) going toward the negative Z direction. The portion SP33a includes a surface SU33a that is in contact with the insulating layer 140_2. The portion SP33b includes a surface SU33b that is in contact with the insulating layer 140_2 on the opposite side of the semiconductor portion SP33. For the semiconductor portion SP33, in the XZ cross-section illustrated in FIG. 20, the distance from the surface SU33a to the surface SU33b is not constant.

The semiconductor portion SP31 has a tapered shape. That is, in the XZ cross-section illustrated in FIG. 20, each of points configuring the surface SU31a is provided at a position (the positive side in the X direction) closer to the central axis of the semiconductor portion SP31 with distance in the negative Z direction. In addition, each of points configuring the surface SU31b is provided at a position (the negative side in the X direction) closer to the central axis of the semiconductor portion SP31 with distance in the negative Z direction. Both of the semiconductor portions SP32 and SP33 have a tapered shape.

In the XZ cross-section illustrated in FIG. 20, a distance from the surface SU31a to the surface SU31b in the X direction at a height position near a lower end of the semiconductor portion SP31 will be referred to as a distance X31. In addition, a distance from the surface SU32a to the surface SU32b in the X direction at a height position near an upper end of the semiconductor portion SP32 will be referred to as a distance X32. In addition, a distance from the surface SU33a to the surface SU33b in the X direction at a height position near an upper end of the semiconductor portion SP33 will be referred to as a distance X33. The distance X33 is more than the distance X31 and the distance X32.

A width of the portion SP33a in the X direction will be referred to as a width X33a. A width of the portion SP33b in the X direction will be referred to as a width X33b. The width X33a and the width X33b are less than the distance X31 and the distance X32, respectively. In addition, the sum of the width X33a and the width X33b is less than the distance X31.

Figure 21:
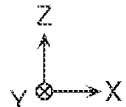
FIG. 21 is a schematic cross-sectional view illustrating aspects of a manufacturing method according to a second modification example.
Figure 21:
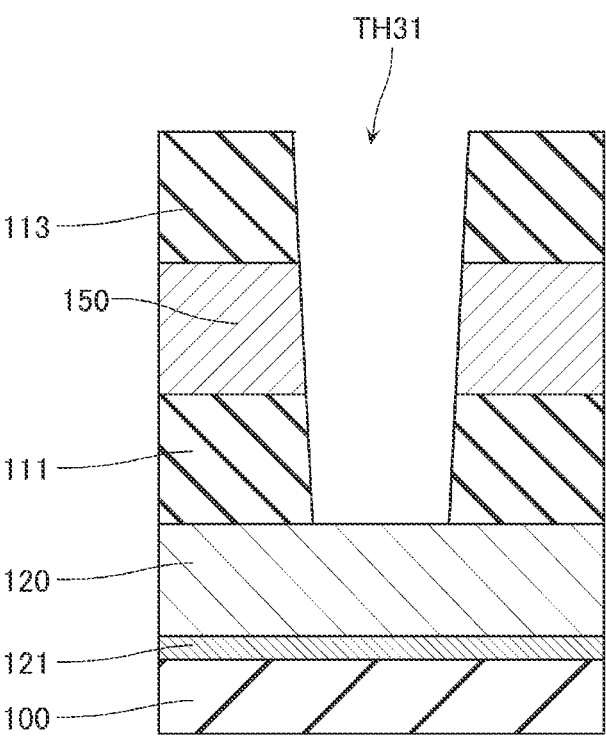

Manufacturing Method According to Second Modification Example of First Embodiment Next, a method of manufacturing a second modification example of the semiconductor device according to the first embodiment will be described with reference to FIGS. 21 and 22.

Basically, the semiconductor device according to the second modification example of the first embodiment is manufactured using the same method as that of the semiconductor device according to the first embodiment. However, in the method of manufacturing the semiconductor device according to the modification example, in a step corresponding to the step described above with reference to FIG. 8, an opening TH31 is formed as illustrated in FIG. 21. The opening TH31 extends in the Z direction, penetrates the insulating layer 113, the conductive layer 150, and the insulating layer 111, and exposes the conductive layer 120. This step is performed by, for example, RIE. This step is performed under a condition where the opening size of the opening TH31 decreases toward the negative side in the Z direction.

Next, for example, a step corresponding to the step described above with reference to FIGS. 9 to 11 is performed.

Figure 22:
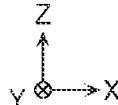
FIG. 22 is a schematic cross-sectional view illustrating aspects of a manufacturing method according to a second modification example.
Figure 22:
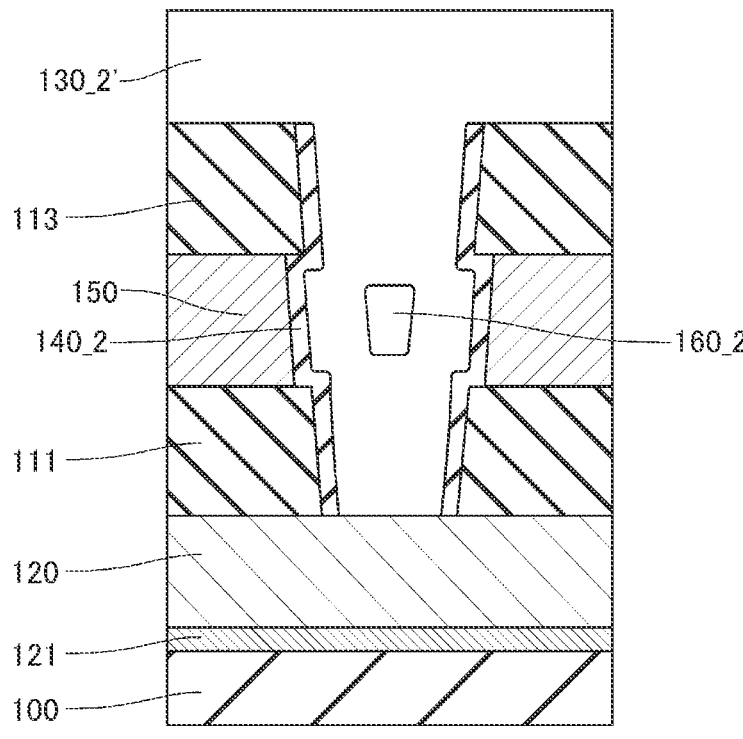

Next, for example, as illustrated in FIG. 22, a semiconductor layer 130_2' is formed in the opening TH31 and on the upper surface of the insulating layer 113. The semiconductor layer 130_2' can be the same material as the semiconductor layer 130. This step is performed by, for example, ALD or CVD. As illustrated in FIG. 22, in this film forming method, the semiconductor layer 130_2' is formed inside and outside the opening TH31 with a relatively uniform film thickness. As a result, the cavity 160_2 where the width in the X direction (the width in the radial direction) decreases toward the negative side in the Z direction is formed.

Next, by performing a step corresponding to the step described with reference to FIG. 14 to form the conductive layer 170, the conductive layer 171, the conductive layer 172, and the conductive layer 173 on the upper surface of the structure illustrated in FIG. 14, the semiconductor device according to the modification example is manufactured.

Third Modification Example of First Embodiment

Figure 23:
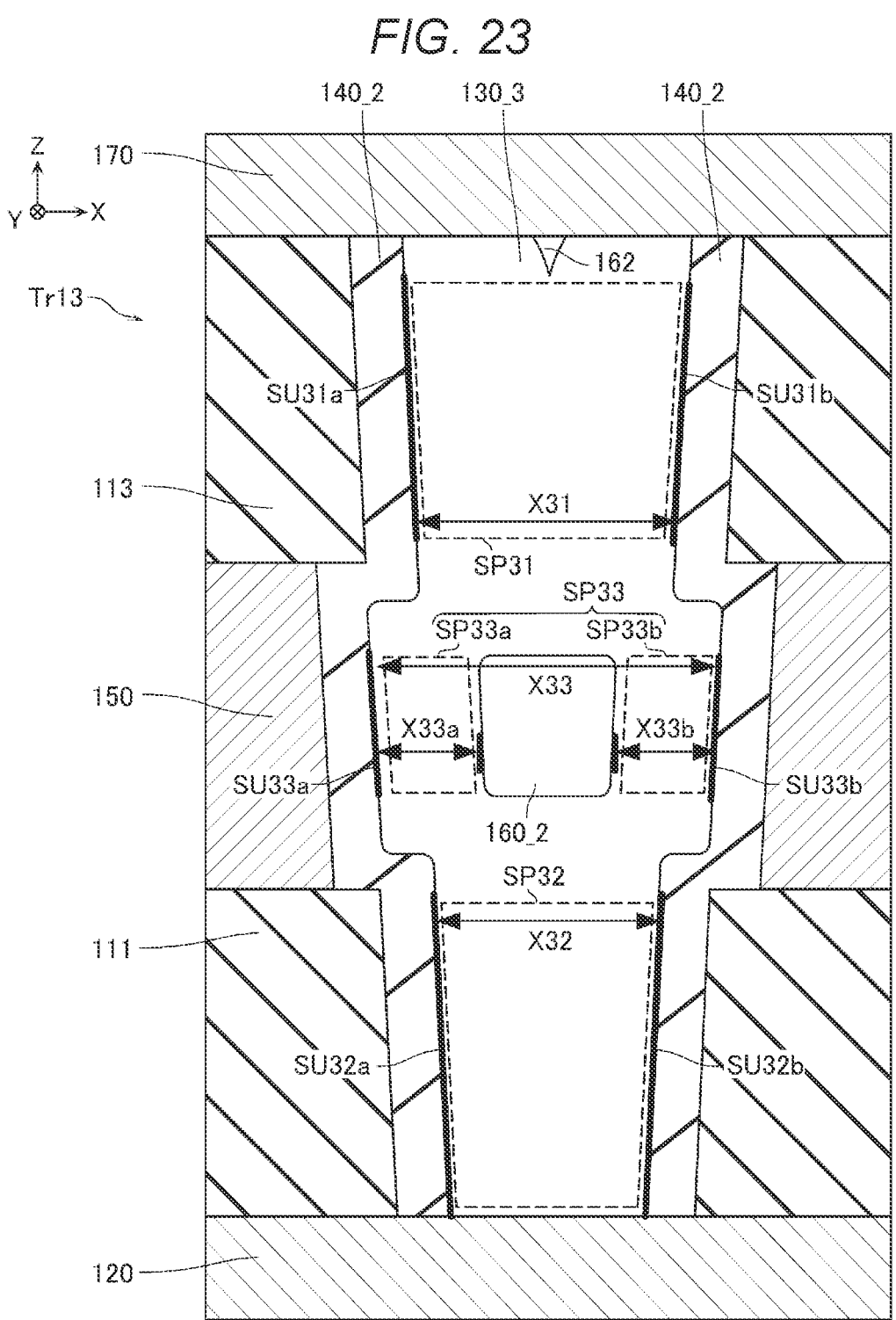
FIG. 23 is a schematic cross-sectional view illustrating aspects of a third modification example of a semiconductor device according to a first embodiment.

Next, a third modification example of the semiconductor device according to the first embodiment will be described with reference to FIG. 23. FIG. 23 is a schematic cross-sectional view illustrating a configuration of a part of the semiconductor device according to the modification example. FIG. 23 illustrates the XZ cross-section. Even when observing a cross-section (for example, an YZ cross-section) other than the XZ cross-section taken along the central axis of a semiconductor layer 130_3, the same structure as that of FIG. 23 is observed. The semiconductor device according to this third modification example includes a transistor structure Tr13 illustrated in FIG. 23.
Transistor Structure Tr13

Basically, the transistor structure Tr13 has the same configuration as the transistor structure Tr12 (FIG. 20). However, in the transistor structure Tr13 (FIG. 23), the semiconductor layer 130_3 is provided instead of the semiconductor layer 130_2 in the transistor structure Tr12 (FIG. 20). A cavity 162 where the width in the X direction (the width in the radial direction) decreases toward the negative side in the Z direction is provided in an upper end portion of the semiconductor layer 130_3. The cavity 162 is an unfilled space like the cavity 160. The conductive layer 170 may be formed at a position corresponding to the cavity 162.

Figure 24:
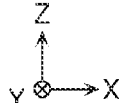
FIG. 24 is a schematic cross-sectional view illustrating aspects of a manufacturing method according to a third modification example.
Figure 24:
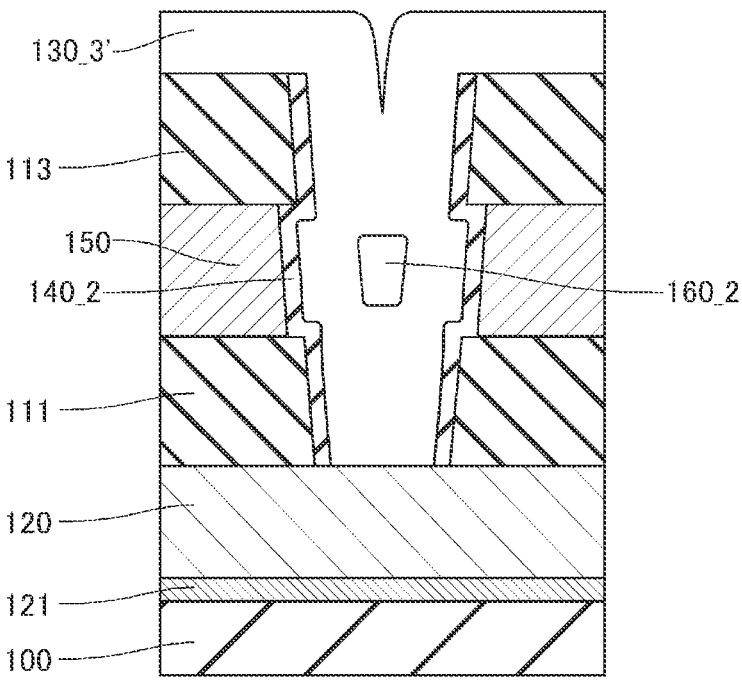

Manufacturing Method According to Third Modification Example of First Embodiment Next, a method of manufacturing the third modification example of the semiconductor device according to the first embodiment will be described with reference to FIG. 24.

Basically, the semiconductor device according to the third modification example of the first embodiment is manufactured using the same method as that of the second modification example (FIG. 20) of the first embodiment. However, in the method of manufacturing the semiconductor device according to this third modification example, in a step corresponding to the step described above with reference to FIG. 22, a semiconductor layer 130_3' (FIG. 24) is formed in the opening TH31 and on the upper surface of the insulating layer 113. The semiconductor layer 130_3' can be the same material as the semiconductor layer 130. This step is performed by, for example, ALD or CVD. As illustrated in FIG. 24, when a difference in the width of the opening size between an upper portion and a lower portion of the opening TH31 is large and the semiconductor layer 130_3' is formed with a relatively uniform film thickness, in some cases, a portion of the semiconductor layer 130_3' corresponding to the cavity 162 is not completely filled.

Next, by performing a step corresponding to the step described with reference to FIG. 14 to form the conductive layer 170, the conductive layer 171, the conductive layer 172, and the conductive layer 173 on the upper surface from which the upper portion of the semiconductor layer 130_3' is removed, the cavity 162 is formed, and the semiconductor device according to this third modification example is manufactured.

Fourth Modification Example of First Embodiment

Figure 25:
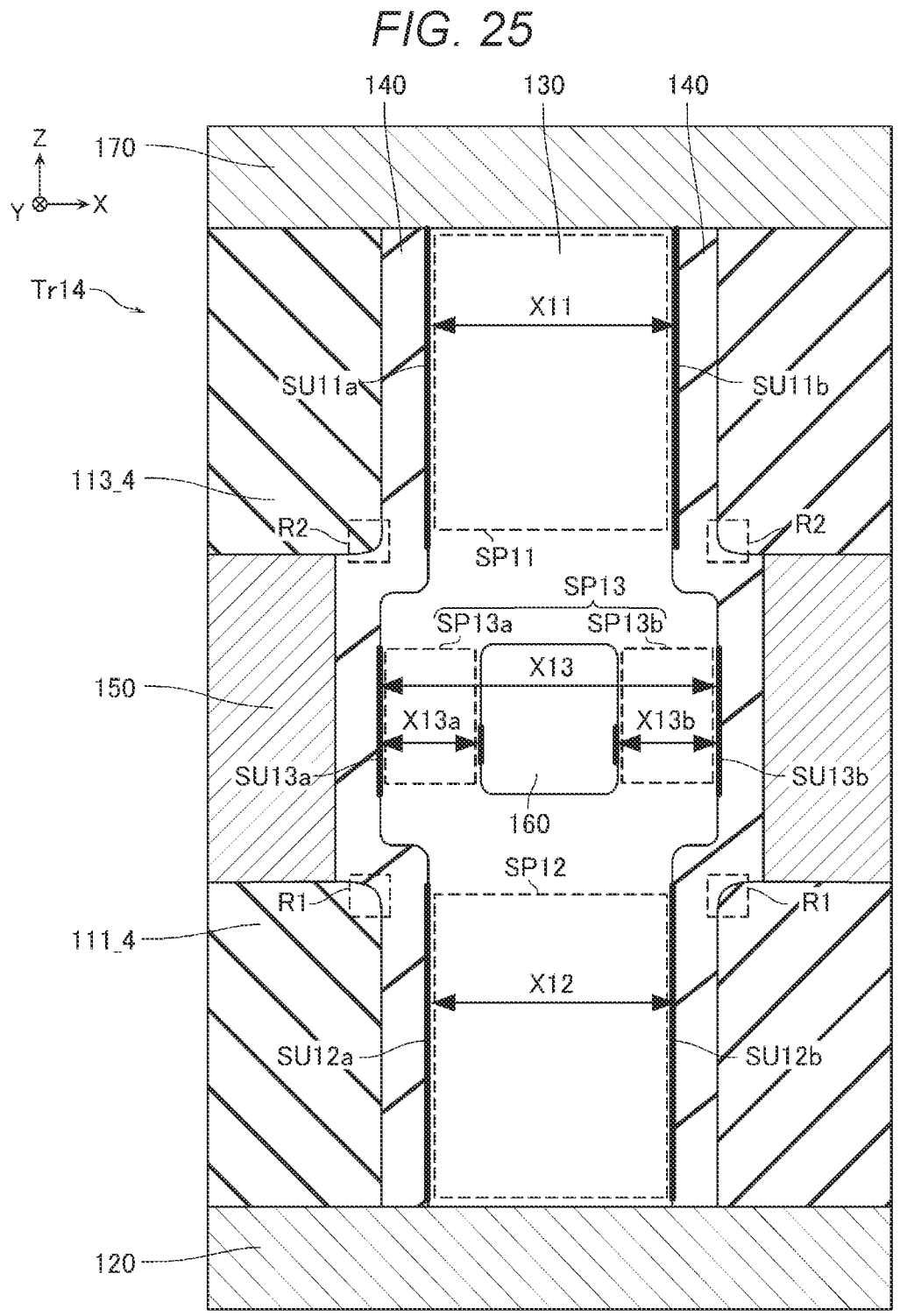
FIG. 25 is a schematic cross-sectional view illustrating aspects of a fourth modification example of a semiconductor device according to a first embodiment.

Next, a fourth modification example of the semiconductor device according to the first embodiment will be described with reference to FIG. 25. FIG. 25 is a schematic cross-sectional view illustrating a configuration of a part of the semiconductor device according to the modification example. FIG. 25 illustrates the XZ cross-section. Even when observing a cross-section (for example, an YZ cross-section) other than the XZ cross-section taken along the central axis of the semiconductor layer 130, the same structure as that of FIG. 25 is observed. The semiconductor device according to the fourth modification example includes a transistor structure Tr14 illustrated in FIG. 25.
Transistor Structure Tr14

Basically, the transistor structure Tr14 has the same configuration as the transistor structure Tr10 (FIG. 6). However, in the transistor structure Tr14 (FIG. 25), an insulating layer 111_4 and an insulating layer 113_4 are provided instead of the insulating layer 111 and the insulating layer 113 in the transistor structure Tr10 (FIG. 6).

In the insulating layer 111_4, in the XZ cross-section illustrated in FIG. 25, a portion R1 is provided near an intersection between virtually extended lines of an upper surface in contact with the conductive layer 150 and a side surface facing the semiconductor layer 130. The portion R1 of the insulating layer 111_4 has a predetermined curvature radius in the XZ cross-section.

In the insulating layer 113_4, in the XZ cross-section illustrated in FIG. 25, a portion R2 is provided near an intersection between virtually extended lines of a lower surface in contact with the conductive layer 150 and a side surface facing the semiconductor layer 130. The portion R2 of the insulating layer 113_4 has a predetermined curvature radius in the XZ cross-section.

Fifth Modification Example of First Embodiment

Figure 26:
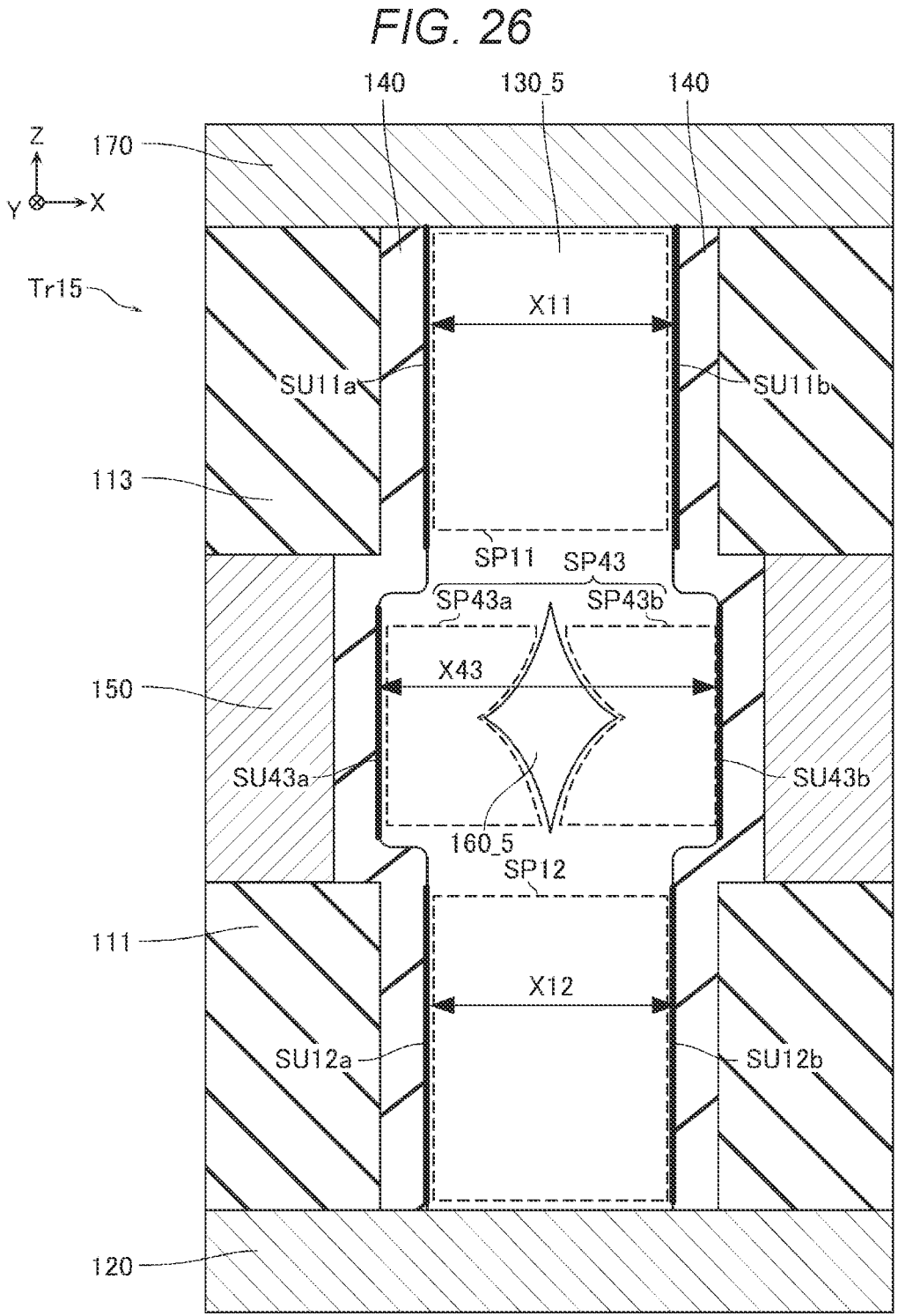
FIG. 26 is a schematic cross-sectional view illustrating aspects of a fifth modification example of a semiconductor device according to a first embodiment.

Next, a fifth modification example of the semiconductor device according to the first embodiment will be described with reference to FIG. 26. FIG. 26 is a schematic cross-sectional view illustrating a configuration of a part of the semiconductor device according to the modification example. FIG. 26 illustrates the XZ cross-section. Even when observing a cross-section (for example, an YZ cross-section) other than the XZ cross-section taken along the central axis of a semiconductor layer 130_5, the same structure as that of FIG. 26 is observed. The semiconductor device according to this fifth modification example includes a transistor structure Tr15 illustrated in FIG. 26.
Transistor Structure Tr15

Basically, the transistor structure Tr15 has the same configuration as the transistor structure Tr10 (FIG. 6). How-ever, in the transistor structure Tr15 (FIG. 26), the semiconductor layer 130_5 and a cavity 160_5 are provided instead of the semiconductor layer 130 and the cavity 160 in the transistor structure Tr10 (FIG. 6). The semiconductor layer 130_5 can be the same material as the semiconductor layer 130. The cavity 160_5 is an unfilled space like the cavity 160.

Basically, the semiconductor layer 130_5 has the same configuration as the semiconductor layer 130. However, the semiconductor layer 130_5 includes a semiconductor portion SP43 (FIG. 26) instead of the semiconductor portion SP13 (FIG. 6).

In the XZ cross-section illustrated in FIG. 26, the semiconductor portion SP43 includes a portion SP43a and a portion SP43b spaced from each other in the X direction. In the portion SP43a and the portion SP43b, the width in the X direction increases from the vicinity of the center in the Z direction toward the positive side and the negative side in the Z direction. The cavity 160_5 is provided between the portion SP43a and the portion SP43b. The portion SP43a includes a surface SU43a that is in contact with the insulating layer 140. The portion SP43b includes a surface SU43b that is in contact with the insulating layer 140. In the semiconductor portion SP43, in the XZ cross-section illustrated in FIG. 26, the distance from the surface SU43a to the surface SU43b is not constant.

A distance from the surface SU43a to the surface SU43b will be referred to as a distance X43. The distance X43 is more than the distance X11 and the distance X12.

In the cavity 160_5, the width in the X direction decreases from the vicinity of the center in the Z direction toward the positive side and the negative side in the Z direction.

Figure 27:
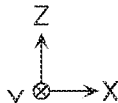
FIG. 27 is a schematic cross-sectional view illustrating aspects of a manufacturing method according to a fifth modification example.
Figure 27:
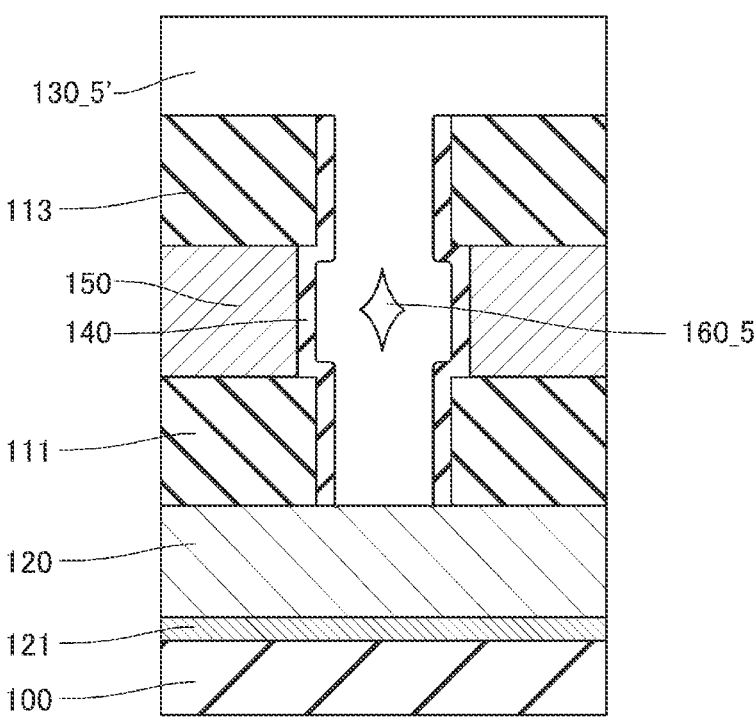

Manufacturing Method According to Fifth Modification Example of First Embodiment Next, a method of manufacturing the fifth modification example of the semiconductor device according to the first embodiment will be described with reference to FIG. 27.

Basically, the semiconductor device according to the fifth modification example of the first embodiment is manufactured using the same method as that of the first embodiment. However, in the method of manufacturing the semiconductor device according to the modification example, in a step corresponding to the step described above with reference to FIGS. 12 and 13, a semiconductor layer 130_5' is formed in the opening TH11 and on the upper surface of the insulating layer 113 as illustrated in FIG. 27. When the semiconductor layer 130_5' is formed, in particular, a condition that a film forming speed is fast is used for a protrusion of an inner wall of the opening TH11. As a result, the cavity 160_5 (FIG. 27) where the width in the X direction decreases from the center in the Z direction toward the positive side and the negative side in the Z direction is formed.

Second Embodiment

Figure 28:
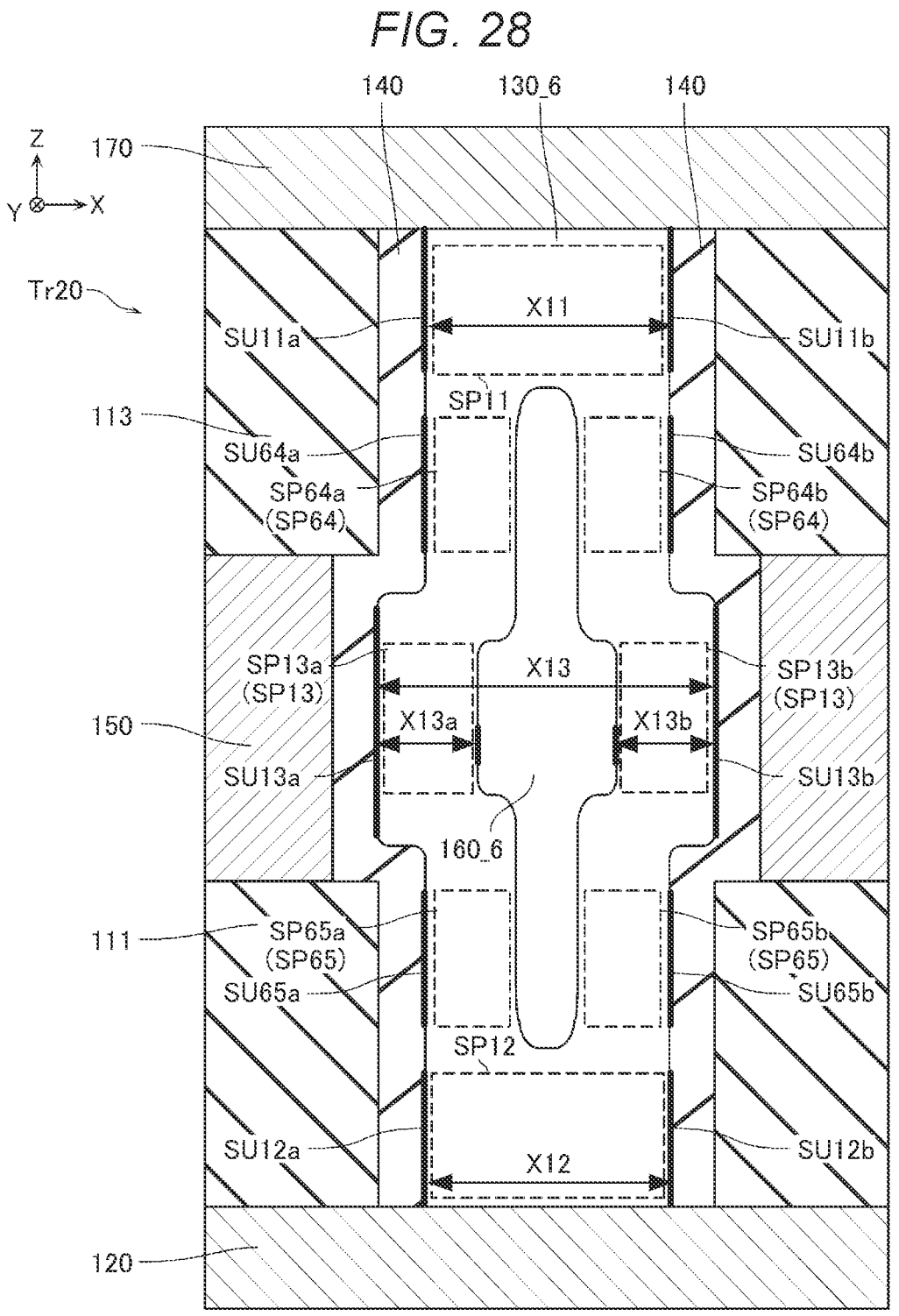
FIG. 28 is a schematic cross-sectional view illustrating aspects of a part of a semiconductor device according to a second embodiment.

Next, a semiconductor device according to a second embodiment will be described using FIG. 28. FIG. 28 is a schematic cross-sectional view illustrating the semiconductor device according to the second embodiment. FIG. 28 illustrates the XZ cross-section. Even when observing a cross-section (for example, an YZ cross-section) other than the XZ cross-section taken along the central axis of a semiconductor layer 130_6, the same structure as that of FIG. 28 is observed. The semiconductor device according to the second embodiment includes a transistor structure Tr20 illustrated in FIG. 28.

Transistor Structure Tr20

Basically, the transistor structure Tr20 has the same configuration as the transistor structure Tr10 (FIG. 6). However, in the transistor structure Tr20 (FIG. 28), the semiconductor layer 130_6 and a cavity 160_6 are provided instead of the semiconductor layer 130 and the cavity 160 in the transistor structure Tr10 (FIG. 6). The semiconductor layer 130_6 is, for example, the same material as the semiconductor layer 130. The cavity 160_6 is an unfilled space like the cavity 160.

Basically, the semiconductor layer 130_6 has the same configuration as the semiconductor layer 130. However, the semiconductor layer 130_6 includes, between the semiconductor portion SP11 and the semiconductor portion SP13, a substantially cylindrical semiconductor portion SP64 that is provided at a position corresponding to the insulating layer 113 in the Z direction. In addition, the semiconductor layer 130_6 includes, between the semiconductor portion SP12 and the semiconductor portion SP13, a substantially cylindrical semiconductor portion SP65 that is provided at a position corresponding to the insulating layer 111 in the Z direction.

In the XZ cross-section illustrated in FIG. 28, the semiconductor portion SP64 includes a portion SP64a and a portion SP64b spaced from each other in the X direction. A part of the cavity 160_6 is provided between the portion SP64a and the portion SP64b. The portion SP64a includes a surface SU64a and is in contact with the insulating layer 140. The portion SP64b includes a surface SU64b that is in contact with the insulating layer 140. In the semiconductor portion SP64, in the XZ cross-section illustrated in FIG. 28, the distance from the surface SU64a to the surface SU64b is not constant.

In the XZ cross-section illustrated in FIG. 28, the semiconductor portion SP65 includes a portion SP65a and a portion SP65b spaced from each other in the X direction. A part of the cavity 160_6 is provided between the portion SP65a and the portion SP65b. The portion SP65a includes a surface SU65a and is in contact with the insulating layer 140. The portion SP65b includes a surface SU65b that is the other surface in the X direction and is in contact with the insulating layer 140. For the semiconductor portion SP65, in the XZ cross-section illustrated in FIG. 28, the distance from the surface SU65a to the surface SU65b is not constant.

In the cavity 160_6, the width in the X direction at a position corresponding to the conductive layer 150 in the Z direction is wider than the width in the X direction at a position corresponding to the insulating layer 111 and the insulating layer 113 in the Z direction.

First Modification Example of Second Embodiment

Figure 29:
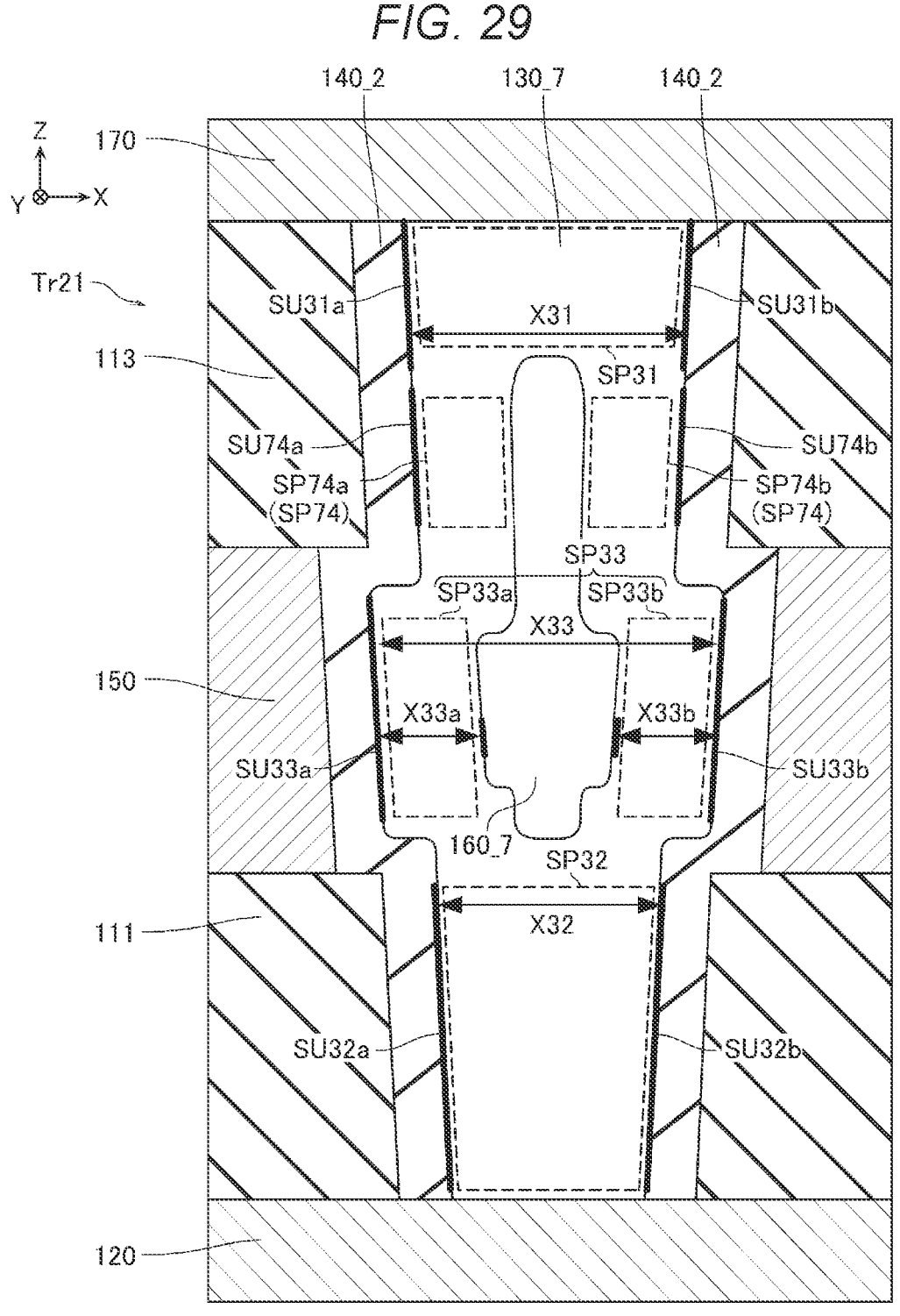
FIG. 29 is a schematic cross-sectional view illustrating aspects of a first modification example of a semiconductor device according to a second embodiment.

Next, a first modification example of the semiconductor device according to the second embodiment will be described with reference to FIG. 29. FIG. 29 is a schematic cross-sectional view illustrating a configuration of a part of the semiconductor device according to this first modification example. FIG. 29 illustrates the XZ cross-section. Even when observing a cross-section (for example, an YZ cross-section) other than the XZ cross-section taken along the central axis of a semiconductor layer 130_7, the same structure as that of FIG. 29 is observed. The semiconductor device according to this first modification example for the second embodiment includes a transistor structure Tr21 illustrated in FIG. 29.

Transistor Structure Tr21

Basically, the transistor structure Tr21 has the same configuration as the transistor structure Tr12 (FIG. 20). However, in the transistor structure Tr21 (FIG. 29), the semiconductor layer 130_7 and a cavity 160_7 illustrated in FIG. 29 are provided instead of the semiconductor layer 130_2 and the cavity 160_2 in the transistor structure Tr12 (FIG. 20). The semiconductor layer 130_7 is, for example, the same material as the semiconductor layer 130_2. The cavity 160_7 is an unfilled space like the cavity 160_2.

Basically, the semiconductor layer 130_7 has the same configuration as the semiconductor layer 130_2. However, the semiconductor layer 130_2 includes, between the semiconductor portion SP31 and the semiconductor portion SP33, a substantially cylindrical semiconductor portion SP74 that is provided at a position corresponding to the insulating layer 113 in the Z direction.

In the XZ cross-section illustrated in FIG. 29, the semiconductor portion SP74 includes a portion SP74a and a portion SP74b spaced from each other in the X direction. A part of the cavity 160_7 is provided between the portion SP74a and the portion SP74b. The portion SP74a includes a surface SU74a that is in contact with the insulating layer 140. The portion SP74b includes a surface SU74b that is in contact with the insulating layer 140 on the opposite side of the semiconductor portion SP74. For the semiconductor portion SP74, in the XZ cross-section illustrated in FIG. 29, the distance from the surface SU74a to the surface SU74b is not constant and a portion of cavity 160_7 is present between the sidewalls.

The semiconductor portion SP74 has a tapered shape as described above with reference to FIG. 20.

In the cavity 160_7, the width in the X direction at a position corresponding to the conductive layer 150 in the Z direction is wider than the width in the X direction at a position corresponding to the insulating layer 113 in the Z direction.

Second Modification Example of Second Embodiment

Figure 30:
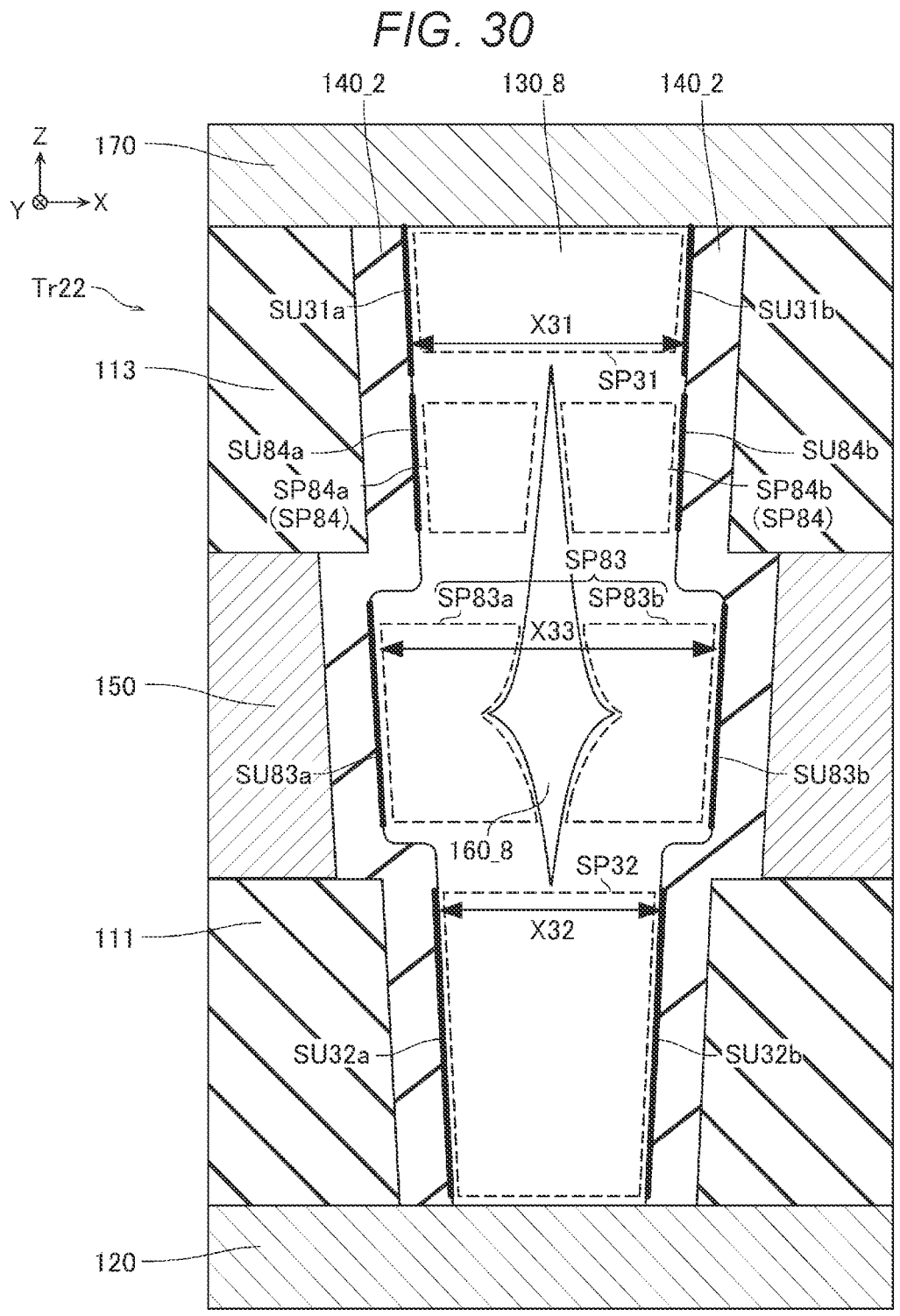
FIG. 30 is a schematic cross-sectional view illustrating aspects of a second modification example of a semiconductor device according to a second embodiment.

Next, a second modification example of the semiconductor device according to the second embodiment will be described with reference to FIG. 30. FIG. 30 is a schematic cross-sectional view illustrating a configuration of a part of the semiconductor device according to the modification example. FIG. 30 illustrates the XZ cross-section. Even when observing a cross-section (for example, an YZ cross-section) other than the XZ cross-section taken along the central axis of a semiconductor layer 130_8, the same structure as that of FIG. 30 is observed. The semiconductor device according to this second modification example of the second embodiment includes a transistor structure Tr22 illustrated in FIG. 30.

Transistor Structure Tr22

Basically, the transistor structure Tr22 has the same configuration as the transistor structure Tr21 (FIG. 29). However, in the transistor structure Tr22 (FIG. 30), the semiconductor layer 130_8 and a cavity 160_8 are provided instead of the semiconductor layer 130_7 and the cavity 160_7 in the transistor structure Tr21 (FIG. 29).

Basically, the semiconductor layer 130_8 has the same configuration as the semiconductor layer 130_7. However, the semiconductor layer 130_8 includes a semiconductor portion SP83 (FIG. 30) instead of the semiconductor portion SP33 (FIG. 29), and includes a semiconductor portion SP84 (FIG. 30) instead of the semiconductor portion SP74 (FIG. 29).

In the XZ cross-section illustrated in FIG. 30, the semiconductor portion SP83 includes a portion SP83a and a portion SP83b spaced from each other in the X direction. In the portion SP83a and the portion SP83b, the width in the X direction increases from the center toward the positive side and the negative side along the Z direction. A part of the cavity 160_8 is provided between the portion SP83a and the portion SP83b. The portion SP83a includes a surface SU83a that is in contact with the insulating layer 140_2. The portion SP83b includes a surface SU83b that is in contact with the insulating layer 140_2 on the opposite side of the semiconductor portion SP83. For the semiconductor portion SP83, in the XZ cross-section illustrated in FIG. 30, the distance from the surface SU83a to the surface SU83b is not constant.

In the XZ cross-section illustrated in FIG. 30, the semiconductor portion SP84 includes a portion SP84a and a portion SP84b spaced from each other in the X direction. A part of the cavity 160_8 is provided between the portion SP84a and the portion SP84b. The portion SP84a includes a surface SU84a that is in contact with the insulating layer 140. The portion SP84b includes a surface SU84b that is also in contact with the insulating layer 140 on an opposite side of SP84. In the semiconductor portion SP84, in the XZ cross-section illustrated in FIG. 30, the distance from the surface SU84a to the surface SU84b is not constant.

For the cavity 160_8, the X direction width decreases from the peak (maximum X direction width) going in both the positive and the negative Z directions.

Third Embodiment

Figure 31:
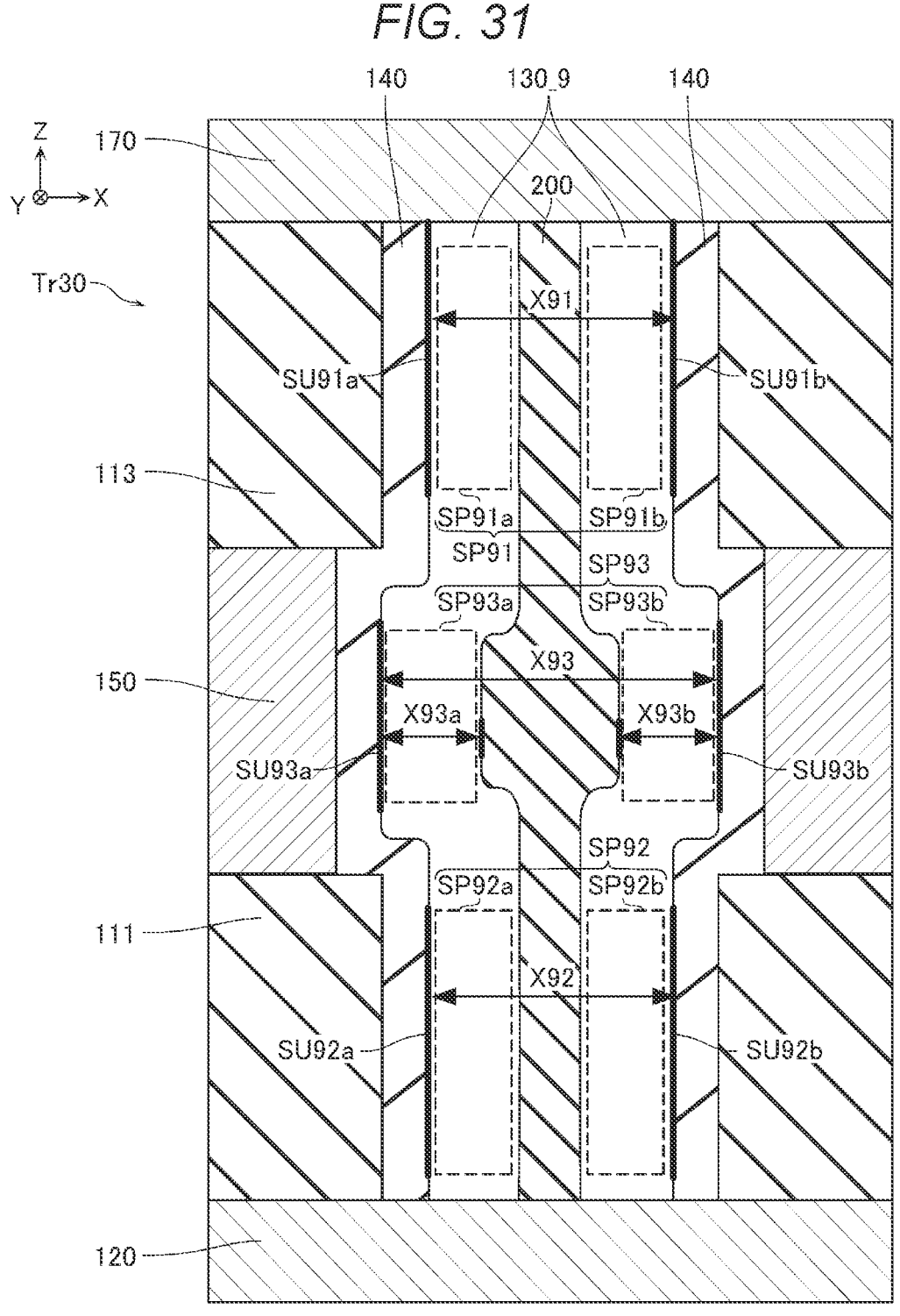
FIG. 31 is a schematic cross-sectional view illustrating aspects of a semiconductor device according to a third embodiment.

Next, a semiconductor device according to a third embodiment will be described using FIG. 31. FIG. 31 is a schematic cross-sectional view illustrating the semiconductor device according to the third embodiment. FIG. 31 illustrates the XZ cross-section. Even when observing a cross-section (for example, an YZ cross-section) other than the XZ cross-section taken along the central axis of a semiconductor layer 130_9, the same structure as that of FIG. 31 is observed. The semiconductor device according to the third embodiment includes, for example, a transistor structure Tr30 illustrated in FIG. 31.

Transistor Structure Tr30

Basically, the transistor structure Tr30 has the same configuration as the transistor structure Tr10 (FIG. 6). However, in the transistor structure Tr30 (FIG. 31), the semiconductor layer 130_9 and an insulating layer 200 are provided instead of the semiconductor layer 130 and the cavity 160 in the transistor structure Tr10 (FIG. 6). The semiconductor layer 130_9 is, for example, the same material as the semiconductor layer 130. The insulating layer 200 is provided in the semiconductor layer 130_9. An outer peripheral surface of the insulating layer 200 is in contact with the semiconductor layer 130_9, an upper surface of the insulating layer 200 is in contact with the conductive layer 170, and a lower surface of the insulating layer 200 is in contact with the conductive layer 120. The insulating layer 200 is, for example, silicon oxide ($SiO_2$).

As illustrated in FIG. 31, the semiconductor layer 130_9 includes, in the Z direction, a substantially cylindrical semiconductor portion SP91 that is provided at a position corresponding to the insulating layer 113, a substantially cylindrical semiconductor portion SP92 that is provided at a position corresponding to the insulating layer 111, and a substantially cylindrical semiconductor portion SP93 that is provided at a position corresponding to the conductive layer 150.

In the XZ cross-section illustrated in FIG. 31, the semiconductor portion SP91 includes a portion SP91a and a portion SP91b spaced from each other in the X direction. A part of the insulating layer 200 is provided between the portion SP91a and the portion SP91b. The portion SP91a includes a surface SU91a that is in contact with the insulating layer 140. The portion SP91b includes a surface SU91b that is in contact with the insulating layer 140 on the opposite side of the semiconductor portion SP91. For the semiconductor portion SP91, in the XZ cross-section illustrated in FIG. 31, a portion of insulating layer 200 is present between the surface SU91a to the surface SU91b so semiconductor portion SP91 is not continuous along the X direction. The upper end portion of the semiconductor portion SP91 is substantially annular and is connected to the conductive layer 170.

In the XZ cross-section illustrated in FIG. 31, the semiconductor portion SP92 includes a portion SP92a and a portion SP92b spaced from each other in the X direction. A part of the insulating layer 200 is provided between the portion SP92a and the portion SP92b. The portion SP92a includes a surface SU92a that is in contact with the insulating layer 140. The portion SP92b includes a surface SU92b that is in contact with the insulating layer 140 on the opposite side of semiconductor portion 92. For the semiconductor portion SP92, in the XZ cross-section illustrated in FIG. 31, the distance from the surface SU92a to the surface SU92b is constant, but a portion of insulating layer 200 is present so the material of semiconductor portion SP 92 is not continuous in the X direction. The lower end portion of the semiconductor portion SP92 is substantially annular and is connected to the conductive layer 120.

In the XZ cross-section illustrated in FIG. 31, the semiconductor portion SP93 includes a portion SP93a and a portion SP93b spaced from each other in the X direction. A part of the insulating layer 200 is provided between the portion SP93a and the portion SP93b. The portion SP93a includes a surface SU93a that is in contact with the insulating layer 140. The portion SP93b includes a surface SU93b that is in contact with the insulating layer 140 on the opposite side of the semiconductor portion SP93. For the semiconductor portion SP93, in the XZ cross-section illustrated in FIG. 31, the distance from the surface SU93a to the surface SU93b is constant, but a portion of insulating layer 200 is present, so the semiconductor portion SP92 is not continuous along the X direction.

A distance from the surface SU91a to the surface SU91b will be referred to as a distance X91. A distance from the surface SU92a to the surface SU92b will be referred to as a distance X92. A distance from the surface SU93a to the surface SU93b will be referred to as a distance X93. The distance X93 is more than the distance X91 and the distance X92.

A width of the portion SP93a in the X direction will be referred to as a width X93a. A width of the portion SP93b in the X direction will be referred to as a width X93b. The width X93a and the width X93b are less than the distance X91 and the distance X92. In addition, the sum of the width X93a and the width X93b is less than the distance X91 and the distance X92.

First Modification Example of Third Embodiment

Figure 32:
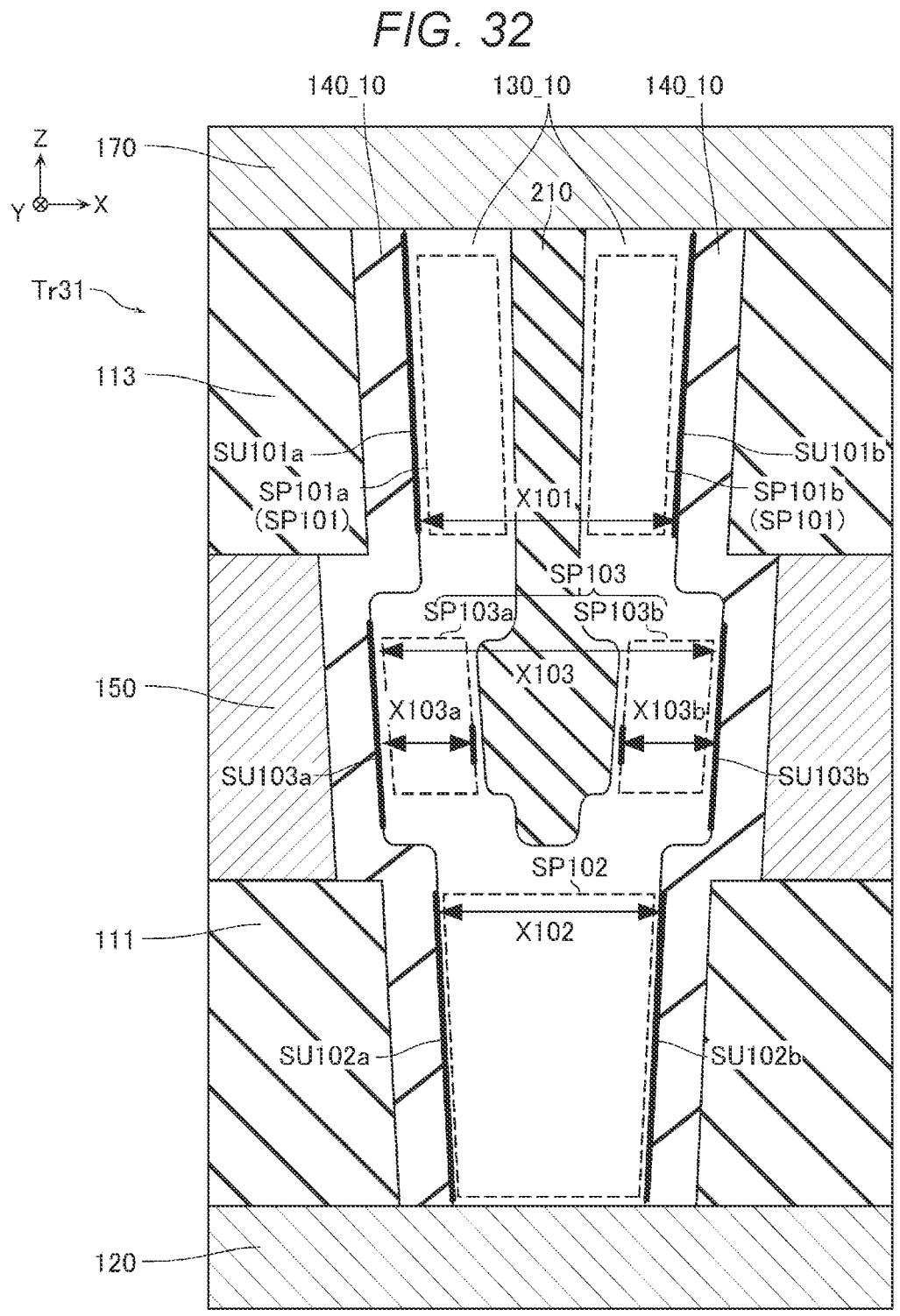
FIG. 32 is a schematic cross-sectional view illustrating aspects of a first modification example of a semiconductor device according to a third embodiment.

Next, a first modification example of the semiconductor device according to the third embodiment will be described with reference to FIG. 32. FIG. 32 is a schematic cross-sectional view illustrating a configuration of a part of the semiconductor device according to the modification example. FIG. 32 illustrates the XZ cross-section. Even when observing a cross-section (for example, an YZ cross-section) other than the XZ cross-section taken along the central axis of a semiconductor layer 130_10, the same structure as that of FIG. 32 is observed. The semiconductor device according to this first modification example of the third embodiment includes a transistor structure Tr31 illustrated in FIG. 32.

Transistor Structure Tr31

Basically, the transistor structure Tr31 has the same configuration as the transistor structure Tr30 (FIG. 31). However, in the transistor structure Tr31 (FIG. 32), the semiconductor layer 130_10, an insulating layer 140_10, and an insulating layer 210 illustrated in FIG. 32 are provided instead of the semiconductor layer 130_9, the insulating layer 140, and the insulating layer 200 in the transistor structure Tr30 (FIG. 31). The semiconductor layer 130_10, the insulating layer 140_10, and the insulating layer 210 can be, for example, the same materials as the semiconductor layer 130_9, the insulating layer 140, and the insulating layer 200.

Basically, the semiconductor layer 130_10 has the same configuration as the semiconductor layer 130_9. However, the semiconductor layer 130_10 includes a substantially cylindrical semiconductor portion SP101, a substantially columnar semiconductor portion SP102, and a substantially cylindrical semiconductor portion SP103 instead of the semiconductor portion SP91, the semiconductor portion SP92, and the semiconductor portion SP93. In each of the semiconductor portion SP101, the semiconductor portion SP102, and the semiconductor portion SP103, as illustrated in FIG. 32, the width in the X direction (the width in the radial direction) decreases toward the negative Z direction.

In the XZ cross-section illustrated in FIG. 32, the semiconductor portion SP101 includes a portion SP101a and a portion SP101b spaced from each other in the X direction. A part of the insulating layer 210 is provided between the portion SP101a and the portion SP101b. In the XZ cross-section illustrated in FIG. 32, the semiconductor portion SP101 includes a surface SU101a that in contact with the insulating layer 140 and a surface SU101b that is in contact with the insulating layer 140 on the opposite side of semiconductor portion SP101. For the semiconductor portion SP101, in the XZ cross-section illustrated in FIG. 32, the distance from the surface SU101a to the surface SU101b is not constant. Also, a portion of insulating layer 210 is present and thus the material of semiconductor portion SP101 is not continuous in the X direction.

In the XZ cross-section illustrated in FIG. 32, the semiconductor portion SP102 includes a surface SU102a that is in contact with the insulating layer 140 and a surface SU102b that is in contact with the insulating layer 140 on the opposite side of the semiconductor portion SP102. For the semiconductor portion SP102, in the XZ cross-section illustrated in FIG. 32, no portion of the insulating layer 210 is provided and the material of semiconductor portion SP102 is thus continuous between the surface SU102a to the surface SU102b in the X direction.

In the XZ cross-section illustrated in FIG. 32, the semiconductor portion SP103 includes a portion SP103a and a portion SP103b spaced from each other in the X direction. A part of the insulating layer 210 is provided between the portion SP103a and the portion SP103b. The portion SP103a includes a surface SU103a that is in contact with the insulating layer 140_2. The portion SP103b includes a surface SU103b that is in contact with the insulating layer 140_2 on the opposite side of the semiconductor portion SP103. In the semiconductor portion SP103, in the XZ cross-section illustrated in FIG. 32, from the distance from the surface SU103a to the surface SU103b is not constant and a portion of the insulating layer 210 is present in the range between the surface SU103a and the surface SU103b along the X direction.

The semiconductor portions SP101, SP102, and SP103 have a tapered shape as described above with reference to FIG. 20.

In the XZ cross-section illustrated in FIG. 32, a distance from the surface SU101a to the surface SU101b in the X direction at a height position near a lower end of the semiconductor portion SP101 will be referred to as a distance X101. In addition, a distance from the surface SU102a to the surface SU102b in the X direction at a height position near an upper end of the semiconductor portion SP102 will be referred to as a distance X102. In addition, a distance from the surface SU103a to the surface SU103b in the X direction at a height position near an upper end of the semiconductor portion SP103 will be referred to as a distance X103. The distance X103 is more than the distance X101 and the distance X102.

A width of the portion SP103a in the X direction will be referred to as a width X103a. A width of the portion SP103b in the X direction will be referred to as a width X103b. The width X103a and the width X103b are less than the distance X101 and the distance X102, respectively. In addition, the sum of the width X103a and the width X103b is less than the distance X101.

Other Embodiments

Semiconductor devices according to the present disclosure are not limited to the example embodiments, and the specific configuration, operation, and the like can be appropriately adjusted.

For example, in an embodiment, the capacitor Cap is connected to the select transistor ST is. However, in other examples, the shape, the structure, and the like of the capacitor Cap can be appropriately adjusted.

In an embodiment, the capacitor Cap is used as a memory unit and is connected to the select transistor ST. However, in other examples, the memory unit does not need to be or include a capacitor Cap. For example, the memory unit may incorporate a ferroelectric element, a ferromagnet element, a chalcogen material (such as GeSbTe), phase change materials, or other materials and record data using characteristics of these materials. For example, in any of the structures described above, the insulating layer between the electrodes forming the capacitor Cap may include any of those other types of materials for different memory unit types.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:

a first insulating layer;

a second insulating layer spaced from the first insulating layer in a first direction;

a first conductive layer between the first insulating layer and the second insulating layer in the first direction;

an oxide semiconductor layer extending in the first direction and facing the first insulating layer, the second insulating layer, and the first conductive layer in a second direction perpendicular to the first direction; and a third insulating layer that is between the first insulating layer and the oxide semiconductor layer, the second insulating layer and the oxide semiconductor layer, and the first conductive layer and the oxide semiconductor layer, wherein the oxide semiconductor layer includes:

a first semiconductor portion at a first position along the first direction corresponding to the first insulating layer, a second semiconductor portion at a second position along the first direction corresponding to the second insulating layer, and a third semiconductor portion at a third position along the first direction corresponding to the first conductive layer, and in a first cross-section along in the first direction and the second direction:

the first semiconductor portion is continuous along the second direction between opposite sides contacting the third insulating layer, the second semiconductor portion is continuous along the second direction between sides contacting the third insulating layer, and the third semiconductor portion is not continuous along the second direction between a first portion contacting the third insulating layer on one side of the third semiconductor portion and a second portion spaced in the second direction from the first portion and contacting the third semiconductor layer on an opposite side of the third semiconductor portion.

2. The semiconductor device according to claim 1, wherein the first semiconductor portion, in the first cross-section, includes:

a first surface that is in contact with the third insulating layer on one side of the first semiconductor portion, and a second surface that is in contact with the third insulating layer on an opposite side of the first semiconductor portion, the second semiconductor portion, in the first cross-section includes:

a third surface that is in contact with the third insulating layer on one side of the second semiconductor portion, and a fourth surface that is in contact with the third insulating layer on an opposite side of the second semiconductor portion, the third semiconductor portion, in the first cross-section includes:

a fifth surface that is in contact with the third insulating layer on one side of the third semiconductor portion, and a sixth surface that is in contact with the third insulating layer on an opposite side of the third semiconductor portion, a distance from the fifth surface to the sixth surface is greater than a distance from the first surface to the second surface, and the distance from the fifth surface to the sixth surface is greater than a distance from the third surface to the fourth surface.

3. The semiconductor device according to claim 1, wherein the oxide semiconductor layer further includes:

a fourth semiconductor portion corresponding in position along the first direction to the first insulating layer, the fourth semiconductor portion being a fourth position between the first position and the third position along the first direction, and the fourth semiconductor portion, in the first cross-section, includes a third portion and a fourth portion spaced from each other in the second direction and in contact with the third insulating layer.

4. The semiconductor device according to claim 3, wherein the oxide semiconductor layer further includes:

a fifth semiconductor portion corresponding in position along the first direction to the second insulating layer, the fifth semiconductor portion being at a fifth position between the second position and the third position along the first direction, and the fifth semiconductor portion, in the first cross-section, includes a fifth portion and a sixth portion spaced from each other in the second direction and in contact with the third insulating layer.

5. The semiconductor device according to claim 1, wherein a cavity is between the first portion and the second portion.

6. The semiconductor device according to claim 5, wherein, in a second cross-section orthogonal to the first direction, the third semiconductor portion surrounds the cavity.

7. The semiconductor device according to claim 1, further comprising:

a second conductive layer connected to one end of the second semiconductor portion in the first direction, wherein the second conductive layer comprises indium and tin.

8. The semiconductor device according to claim 7, further comprising:

a third conductive layer connected to one end of the first semiconductor portion in the first direction, wherein the third conductive layer comprises indium and tin.

9. A semiconductor device, comprising:

a first insulating layer;

a second insulating layer spaced from the first insulating layer in a first direction;

a first conductive layer between the first insulating layer and the second insulating layer in the first direction;

an oxide semiconductor layer extending in the first direction and facing the first insulating layer, the second insulating layer, and the first conductive layer in a second direction perpendicular to the first direction; and a third insulating layer that is between the first insulating layer and the oxide semiconductor layer, the second insulating layer and the oxide semiconductor layer, and the first conductive layer and the oxide semiconductor layer, wherein the oxide semiconductor layer includes:

a first semiconductor portion at a first position along the first direction corresponding to the first insulating layer, a second semiconductor portion at a second position along the first direction corresponding to the second insulating layer, and a third semiconductor portion at a third position along the first direction corresponding to the first conductive layer, and in a first cross-section along the first direction and the second direction:

the first semiconductor portion has:

a first surface that is in contact with the third insulating layer on one side of the first semiconductor portion, and a second surface that is in contact with the third insulating layer on another side of the first semiconductor portion, the second semiconductor portion has:

a third surface that is in contact with the third insulating layer on one side of the second semiconductor portion, and a fourth surface that is in contact with the third insulating layer on another side of the second semiconductor portion, the third semiconductor portion has:

a first portion and a second portion spaced from each other in the second direction, a fifth surface that is in contact with the third insulating layer on one side of the third semiconductor portion, and a sixth surface that is in contact with the third insulating layer on another side of the third semiconductor portion, a distance from the fifth surface to the sixth surface is greater than a distance from the first surface to the second surface, and the distance from the fifth surface to the sixth surface is greater than a distance from the third surface to the fourth surface.

10. The semiconductor device according to claim 9, wherein a cavity is between the first portion and the second portion.

11. The semiconductor device according to claim 10, wherein, in a second cross-section orthogonal to the first direction, the third semiconductor portion surrounds the cavity.

12. The semiconductor device according to claim 9, further comprising:

a second conductive layer connected to one end of the second semiconductor portion in the first direction, wherein the second conductive layer comprises indium and tin.

13. The semiconductor device according to claim 12, further comprising:

a third conductive layer connected to one end of the first semiconductor portion in the first direction, wherein the third conductive layer comprises indium and tin.

14. The semiconductor device according to claim 9, wherein the first semiconductor portion includes a seventh portion and an eighth portion spaced from each other in the second direction, a fourth insulating layer is between the seventh portion and the eighth portion in the second direction, and a fifth insulating layer is between the first portion and the second portion in the second direction.

15. The semiconductor device according to claim 14, wherein a width of the fifth insulating layer in the second direction is greater than a width of the fourth insulating layer in the second direction.

16. The semiconductor device according to claim 14, wherein the third semiconductor portion surrounds the fifth insulating layer in a plane orthogonal to the first direction.

17. The semiconductor device according to claim 14, wherein the oxide semiconductor layer further includes:

a fifth semiconductor portion corresponding to in position along the first direction to the second insulating layer, the fifth semiconductor portion being at a fifth position between the second position and the third position along the first direction, the fifth semiconductor portion, in the first cross-section, includes a ninth portion and a tenth portion spaced from each other in the second direction, and a sixth insulating layer is between the ninth portion and the tenth portion I the second direction.

18. A semiconductor memory device, comprising:

a first wiring layer;

a second wiring layer spaced from the first wiring layer in a first direction;

a third wiring layer between the first and second wiring layers in the first direction;

a first insulating layer between the first wiring layer and the third wiring layer in the first direction;

a second insulating layer between the second wiring layer and the third wiring layer in the first direction;

an oxide semiconductor column extending in the first direction from the first wiring layer to second wiring layer through the first insulating layer, the third wiring layer, and the second insulating layer;

a third insulating layer on the oxide semiconductor column between the oxide semiconductor column between each of the first insulating layer, the third wiring layer, and the second insulating layer in a second direction perpendicular to the first direction, wherein an outer dimension of the oxide semiconductor column in the second direction is at a maximum at a position along the first direction corresponding to the third wiring layer, and a cavity is inside the oxide semiconductor column at the position along the position along the first direction corresponding to the third wiring layer.

19. The semiconductor memory device according to claim 18, wherein the cavity is filled with an insulating material.

20. The semiconductor memory device according to claim 18, wherein the cavity is present inside the oxide semiconductor column at positions along the first direction corresponding to the first insulating layer.

* * * * *